US011004619B2

(12) United States Patent
Ashtekar

(10) Patent No.: US 11,004,619 B2
(45) Date of Patent: May 11, 2021

(54) CIRCUIT INTERRUPTERS WITH NON-CONTACT SENSOR SYSTEMS FOR EVALUATING EROSION OF ELECTRICAL CONTACTS AND RELATED METHODS

(71) Applicant: Eaton Intelligent Power Limited, Dublin (IE)

(72) Inventor: Koustubh Dnyandeo Ashtekar, Moon Township, PA (US)

(73) Assignee: Eaton Intelligent Power Limited, Dublin (IE)

( * ) Notice: Subject to any disclaimer, the term of this patent is extended or adjusted under 35 U.S.C. 154(b) by 224 days.

(21) Appl. No.: 16/218,549

(22) Filed: Dec. 13, 2018

(65) Prior Publication Data

US 2020/0194191 A1 Jun. 18, 2020

(51) Int. Cl.

| *G01R 31/327* | (2006.01) |
|---|---|
| *G01R 31/28* | (2006.01) |
| *H01H 33/66* | (2006.01) |
| *H01H 1/00* | (2006.01) |
| *G01R 31/333* | (2006.01) |
| *H01H 33/666* | (2006.01) |
| *H01H 11/00* | (2006.01) |

(52) U.S. Cl.
CPC ....... *H01H 1/0015* (2013.01); *G01R 31/3274* (2013.01); *G01R 31/3333* (2013.01); *H01H 33/666* (2013.01); *G01R 31/3275* (2013.01); *H01H 11/0062* (2013.01)

(58) Field of Classification Search
CPC .... G01R 31/02; G01R 31/327; G01R 31/333; G01R 31/28; H01H 33/66; H01H 33/664; H01H 33/666
See application file for complete search history.

(56) References Cited

U.S. PATENT DOCUMENTS

| 5,566,041 | A | * | 10/1996 | Rumfield | ................. H01H 9/56 218/154 |
|---|---|---|---|---|---|
| 6,002,560 | A | * | 12/1999 | Nguyen | ............... H01H 1/0015 361/115 |
| 8,952,826 | B2 | | 2/2015 | Leccia et al. | |
| 9,378,901 | B2 | | 6/2016 | Ashtekar et al. | |
| 2006/0181267 | A1 | * | 8/2006 | Marchand | .......... G01R 31/3271 324/750.14 |
| 2014/0217898 | A1 | * | 8/2014 | Richards | ................ H01R 24/78 315/121 |

OTHER PUBLICATIONS

OMRON Corporation "Displacement Sensors/Measurement Sensors" Technical Guide, https://www.ia.omron.com/support/guide/56/introduction.html (7 pages) (2007-2018).

* cited by examiner

*Primary Examiner* — Neel D Shah
(74) *Attorney, Agent, or Firm* — Myers Bigel, P.A.

(57) ABSTRACT

Circuit interrupters with opto-electronic and/or acoustic systems that can measure displacement over time, optionally along with interrupt current measurements, during an opening and closing event with signal data collected when triggered by a "breaker open" or "breaker close" event.

19 Claims, 16 Drawing Sheets

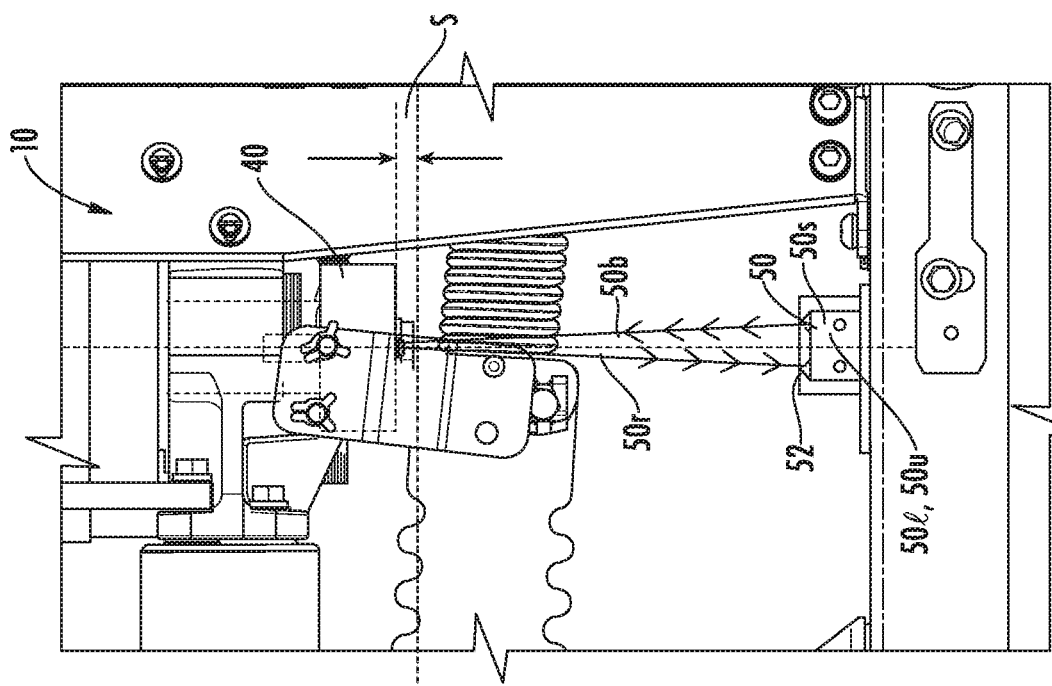
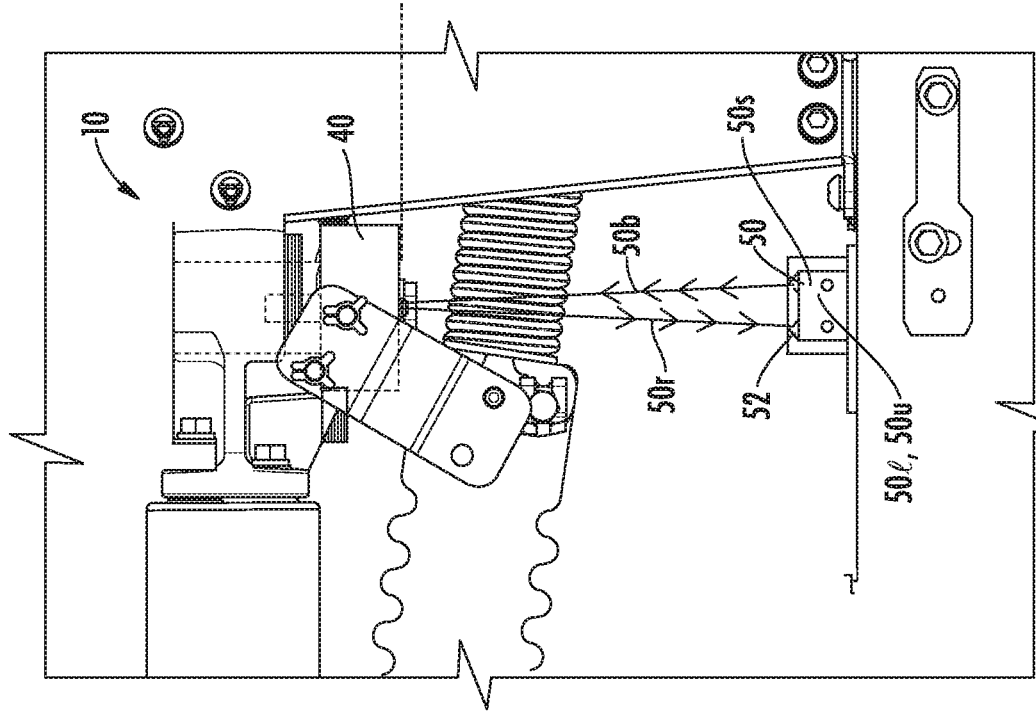

CONTACT CLOSING CURVE

CONTACT OPENING CURVE

CIRCUIT INTERRUPTERS WITH NON-CONTACT SENSOR SYSTEMS FOR EVALUATING EROSION OF ELECTRICAL CONTACTS AND RELATED METHODS

FIELD OF THE INVENTION

The present invention relates to circuit interrupters.

BACKGROUND OF THE INVENTION

Circuit interrupters provide protection for electrical systems from electrical fault conditions such as, for example, current overloads, short circuits and abnormal level voltage conditions. Typically, circuit interrupters include a stored energy type operating mechanism which opens electrical contacts to interrupt the current through the conductors of an electrical system in response to abnormal conditions, although a wide range of driving mechanisms may be employed.

Circuit interrupters can be high voltage or low voltage. Referring to FIG. 2A, circuit interrupters, such as, for example, power circuit breakers for systems operating above about 1,000 volts, typically utilize vacuum interrupters 15 (VIs) as the switching devices but lower rated devices may also use VIs. The circuit interrupters include separable main contacts 16, 17 disposed within an insulating housing 15h. Generally, one of the contacts 16 is fixed relative to both the housing 15h and to an external electrical conductor which is interconnected with the power circuit associated with the circuit interrupter. The other contact 17 is moveable. In the case of a VI, the moveable contact assembly usually comprises a stem 15s of circular cross-section having the contact 17 at one end enclosed within a vacuum chamber 15c and a driving mechanism 18 coupled at the other end which is external to the vacuum chamber 15c. An operating rod assembly comprising a push rod 19, which is fastened to the end of the stem 15s opposite the moveable contact 17, and a driving mechanism 18 provide the motive force to move the moveable contact 17 into or out of engagement with the fixed contact 16. See, e.g., U.S. Pat. No. 8,952,826 to Leccia et al., the contents of which are hereby incorporated by reference as if recited in full herein.

VIs are typically used, for instance, to reliably interrupt medium voltage alternating current (AC) currents and, also, high voltage AC currents of several thousands of amperes or more. Conventionally, one VI is provided for each phase of a multi-phase circuit and the VIs for the several phases are actuated simultaneously by a common operating mechanism, or separately by separate operating mechanisms (and separate auxiliary switches).

Over the life of a VI, the surface of each of the contacts can erode due to the arcing that occurs between the contacts 16, 17 (FIG. 2A) during each interruption. For example, each contact can lose 3-5 mm of material over its life due to erosion. This loss of material is taken up by the contact spring, causing it to lose some of its compression. This loss of compression translates to a loss of compressive force (or contact wipe) on the contacts within the VI. As is well known to those of skill in the art, sufficient contact force is important to the performance of VIs. In particular, insufficient contact force increases the risk of overheating or explosion in the event of a short circuit and failure to interrupt the circuit. Thus, it can be important to monitor the amount of contact erosion over the life of a VI in order to monitor the extent to which contact force is decreasing. Such monitoring, however, is difficult or even impossible in current designs, where visual access to the contacts is limited unless the breaker is removed from a switchgear and operated "off-line" for contact erosion or nonexistent, e.g., designs where the contacts are hidden. See, FIG. 1A (breaker OPEN) and FIG. 1B (breaker closed) which show a visual inspection method of evaluating erosion based on an erosion line $E_L$ from a back of a breaker in a power off configuration. The erosion line $E_L$ is visually inspected only when the breaker is manually closed (FIG. 1B). If the erosion line $E_L$ is visible, then the VI 15 is deemed acceptable. If the erosion line $E_L$ is not visible (the line enters the VI chamber 15c along with the stem 15s), the VI contacts 16, 17 (FIG. 2A) are eroded beyond desired limits and the corresponding pole unit assembly should be replaced. This is a "binary" evaluation. The erosion line $E_L$ is used to either identify the VI as "good" or "bad".

FIGS. 2A and 2B illustrate another prior art evaluation method using a "WIPE" evaluation method which also requires that the breaker/VI be taken out of the operating system for evaluation. The noted wear discussed above affects the contact wipe. That is, the contact "WIPE" is the force holding the vacuum interrupter contacts 16, 17 closed and the energy available to hammer the contacts 16, 17 open with sufficient speed for reliable interruption. A related measurement is the contact "stroke." Stroke is the gap between the fixed and moving contacts 16, 17 of a circuit breaker, i.e., a VI 15, when the circuit breaker contacts are in the open, first position. The circuit breaker operating mechanism provides a fixed amount of motion to a second contact assembly. The first portion of the motion is used to close the contacts (i.e., stroke) and the remainder is used to further compress a (preloaded) wipe spring 14. This additional compression is called WIPE. WIPE and stroke are thus generally related to each other by relation: total displacement=Stroke+WIPE. Thus, as the stroke increases due to the erosion of contacts, the WIPE decreases.

The height from the top of the conductor (conductor gap when breaker is OPEN) M1 and a second height M2 (conductor gap when breaker is closed) can be measured. M3 is the measured WIPE (usually factory set to 5.0 mm) Erosion=$\Delta 1+\Delta 2$=(M2−M1)+(5.0−M3). Erosion<3.0 mm is indicated as acceptable criteria; Erosion>3.0 mm is indicated as rejection criteria.

There remains a need for systems that can detect and/or monitor the amount of contact erosion over the life of a VI and that can be carried out with the VI in an operable "power on" position without requiring manual inspection and/or operator-visual access to the contacts.

SUMMARY OF EMBODIMENTS OF THE INVENTION

Embodiments of the present invention provide circuit interrupters that include non-contact optical or acoustic sensor systems that can obtain signal data to measure displacement over time, optionally along with obtaining electric current measurements during an arcing event triggered by a "breaker open" or "breaker close" event.

Embodiments of the invention can generate displacement curves of displacement over time that can be used to calculate velocity associated with the contacts during an arcing event. That, optionally along with current measurements of electric current occurring during an arcing event, whether a continuous or short circuit event, can be used to predict a remaining useful life of the circuit interrupter and/or erosion status of the main contacts.

Embodiments of the invention can provide erosion assessment systems using a non-contact (touchless) evaluation of contact erosion using light output from an optical source that is projected along a defined axis and one or more light detection sensors for detecting displacement data for each phase of the circuit interrupter and signal data can be obtained during each arcing event for "real-time" data associated with erosion status or expected service life remaining of the main contacts of the circuit interrupter for dynamic evaluations that can be updated in real-time for allowing preventive service scheduling without disengaging the circuit interrupter.

Embodiments of the invention are directed to a circuit interrupter that includes: a housing with a base; a fixed main contact in the housing; a movable main contact in the housing in cooperating alignment with the fixed main contact; an elongate stem coupled to the movable main contact and extending away from the fixed main contact; a drive assembly coupled to the elongate stem and configured to move the movable main contact between open and closed positions relative to the fixed main contact; and a non-contact sensor that includes an emitter source and a cooperating receiver sensor in the housing configured to acquire a light and/or acoustic signal that provides displacement data to thereby allow for evaluation of erosion status of the fixed and movable main contacts.

The non-contact sensor can be an optical sensor. The emitter source can be a light source. The circuit breaker can include at least one internal reflector in optical communication with the emitter source and coupled to the elongate stem.

The non-contact sensor can be an acoustic sensor.

The emitter source can be an ultrasound source.

The circuit interrupter can further include an attachment member coupled to a lower end portion of the moving stem. The attachment member can move in concert with the moving stem. The circuit interrupter can include a vacuum chamber enclosing the fixed and movable main contacts. The elongate stem can reside outside the vacuum chamber.

The attachment member can include a reflector surface that faces the emitter source.

The circuit interrupter can further include an attachment member coupled to the moving stem. The attachment member can move in concert with the moving stem and can hold the emitter source.

The base can include a plurality of externally visible wheels. The fixed main contact in the housing can be a first fixed main contact. The movable main contact can be a first movable main contact in cooperating alignment with the first fixed main contact. The elongate stem can be a first elongate stem that is coupled to the first movable main contact. The drive assembly can be a first drive assembly coupled to the first elongate stem. The attachment member can be a first attachment member associated with a first pole of the circuit interrupter. The non-contact sensor can be a first non-contact sensor. The emitter source can be a first emitter source and the cooperating receiver sensor can be a cooperating first receiver sensor. The circuit interrupter can further include: a second fixed main contact in the housing; a second movable main contact in the housing in cooperating alignment with the fixed main contact; a second elongate stem coupled to the second movable main contact and extending away from the second fixed main contact; a second drive assembly coupled to the second elongate stem; a second attachment member in the housing associated with a second pole; and a second non-contact sensor comprising a second emitter source and a cooperating second receiver sensor in the housing configured to acquire sensor signal that provides displacement data to thereby allow for evaluation of erosion status of the second fixed and second movable main contacts.

The circuit interrupter can further include a control circuit in communication with the non-contact sensor that can trigger the non-contact sensor to acquire the sensor signal at successive defined intervals during opening and closing of the movable main contact and generates a respective opening and closing travel curve of distance over time.

The control circuit can trigger the non-contact sensor to obtain the signal of the reflected light beam at successive intervals in response to (i) a trigger signal from a start of the movable main contact closing whereby the movable main contact travels to the closed position and (ii) a trigger signal from a start of opening of the movable main contact whereby the movable main contact travels to the open position.

At least some of the successive intervals can be in a range of 50 µs to 1 millisecond during the opening and the closing.

The circuit interrupter can further include a control circuit that is in communication with the non-contact sensor and that is configured to determine when displacement data is at a steady state condition associated with a fully open or fully closed state of the circuit interrupter.

The circuit interrupter can be a vacuum interrupter (VI).

The control circuit can be configured to identify a service needed date, based, at least in part, on: (i) a predicted number of operations (NOP) of the VI life which is inversely proportional to the heat generated (Q) and NOP is calculated by:

$$NOP = K \frac{1}{t \times I_{sc}^2}.$$

where K=a physical constant for a particular VI, and VI is approximate equal to 1/R and can be assumed as constant or physical property, and (ii) a physics of failure equation for VI contact wear of the fixed and movable main contacts which is calculated in a linear form by:

$$\ln(NOP) = \ln(K) - \ln(t) - 2 \times \ln(I_{sc})$$

where t=short current carrying time (usually in ms), and $I_{sc}$=short circuit current.

The control circuit can be coupled to a current transformer and is configured to obtain interrupt current measurements (amperage) at the current transformer concurrently with acquisition of the displacement data.

The attachment member can have a receiving channel that slidably receives the elongate stem.

The attachment member can include a planar surface that faces the emitter source, optionally with a tapered outer wall.

The emitter source can be configured to project the sensor signal upward toward the elongate stem.

The emitter source can be configured to project the sensor signal laterally inward toward the elongate stem.

The emitter source can be configured to move in concert with the elongate stem.

The emitter source can be a laser of a non-contact measurement or displacement sensor as the non-contact sensor. The laser and receiver sensor can be held by a unitary housing.

The circuit interrupter can be a three pole device. The non-contact sensor can be provided as three emitter sources and three receiver sensors, one for each of the three poles.

A laterally extending mounting bracket can hold the three emitter sources inside the housing, one emitter source aligned with terminals of a respective one of the three poles.

Still other embodiments are directed to kits with a non-contact erosion evaluation system for a circuit interrupter. The kits can include: a plurality of emitter sources configured to emit sensor signals; a plurality of receiver sensors configured to acquire signal associated with the emitted sensor signals; and at least one installation bracket configured to support the plurality of emitter sources and the plurality of receiver sensors. The installation bracket is configured to be mounted inside the circuit interrupter.

The kit can further include a plurality of attachment members, sized and configured to attach to a respective stem coupled to a movable main contact, optionally each comprising one or more reflectors or reflector surfaces configured to reflect the emitted signals to the receiver sensors.

The plurality of attachment members can have a body with a medial downwardly extending channel sized and configured to slidably receive and couple to a stem of a movable main contact.

Additional embodiments are directed toward methods of evaluating erosion status of main contacts of a circuit interrupter. The methods can include: transmitting from an optical or acoustic sensor a respective light or acoustic sensor signal toward a defined position in the circuit interrupter; receiving a light or acoustic sensor in response to the transmitted light or acoustic sensor signal; electronically acquiring displacement data over time from the optical or acoustic sensor, optionally wherein the acquiring is carried out in intervals of every 50 μs to every 2 ms during closing and opening events of the main contacts of the circuit interrupter, further optionally about every 1 ms during an arcing event; and electronically determining erosion status of the main contacts of the circuit interrupter during or after each opening and closing event while the circuit interrupter remains in an active, engaged state with a switchgear.

Optionally the circuit interrupter is a vacuum interrupter (VI), and the method optionally comprises electronically identify a future service needed date, based, at least in part, on: (i) number of operations (NOP) of VI life which is inversely proportional to the heat generated (Q) and NOP is calculated by:

$$NOP = K \frac{1}{t \times I_{sc}^2}.$$

where K=a physical constant for a particular VI, and VI is approximately equal to 1/R and can be assumed as constant or physical property, and (ii) a physics of failure equation for VI contact wear of the fixed and movable main contacts which is calculated in a linear form by:

$$\ln(NOP)=\ln(K)-\ln(t)-2\times\ln(I_{sc})$$

where t=short time current carrying time (usually in ms), and $I_{sc}$=short circuit current.

Embodiments of the invention can provide erosion assessment systems using a non-contact (touchless) evaluation of contact erosion using acoustic output from acoustic source emitter such as an ultrasound source that projects acoustic waves along a defined axis and one or more receiver sensors for detecting displacement data for each phase of the circuit interrupter and signal data can be obtained during each arcing event for "real-time" data associated with erosion status or expected service life remaining of the main contacts of the circuit interrupter for dynamic evaluations that can be updated in real-time for allowing preventive service scheduling without disengaging the circuit interrupter.

Further features, advantages and details of the present invention will be appreciated by those of ordinary skill in the art from a reading of the figures and the detailed description of the preferred embodiments that follow, such description being merely illustrative of the present invention.

It is noted that aspects of the invention described with respect to one embodiment, may be incorporated in a different embodiment although not specifically described relative thereto. That is, all embodiments and/or features of any embodiment can be combined in any way and/or combination. Applicant reserves the right to change any originally filed claim or file any new claim accordingly, including the right to be able to amend any originally filed claim to depend from and/or incorporate any feature of any other claim although not originally claimed in that manner. These and other objects and/or aspects of the present invention are explained in detail in the specification set forth below.

BRIEF DESCRIPTION OF THE DRAWINGS

FIGS. 5A and 5B are partial side views of the circuit breaker shown in FIG. 3, FIG. 5A illustrating an OPEN configuration and FIG. 5B illustrating a CLOSED configuration with Stroke movement according to embodiments of the present invention.

DETAILED DESCRIPTION OF EMBODIMENTS OF THE INVENTION

Figure 1A:
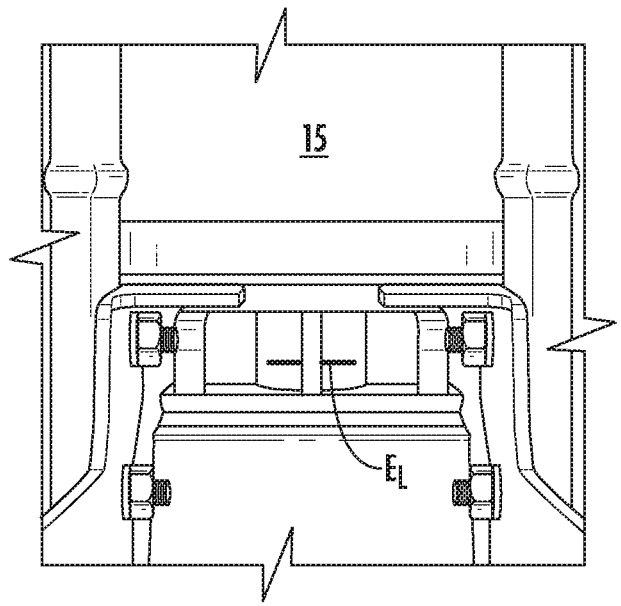
FIG. 1A is a rear view of a prior art VI (breaker OPEN) with an "Erosion line".
Figure 1B:
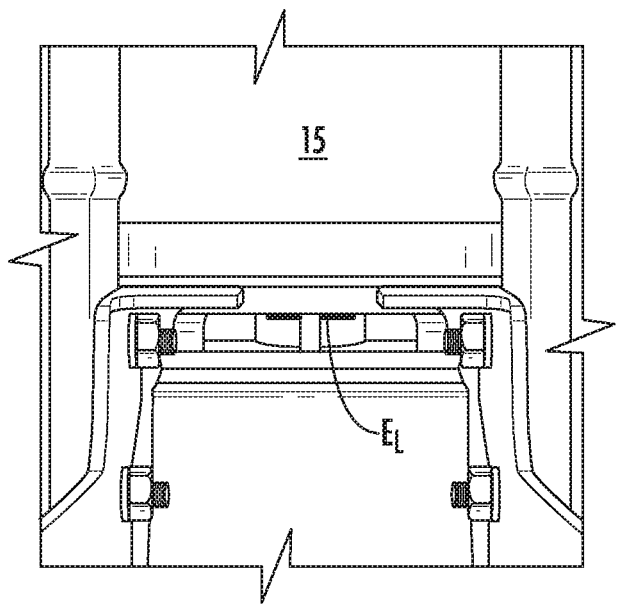
FIG. 1B is a rear view of the prior art device shown in FIG. 1A with the breaker CLOSED.

The present invention now will be described more fully hereinafter with reference to the accompanying drawings, in which illustrative embodiments of the invention are shown. Like numbers refer to like elements and different embodiments of like elements can be designated using a different number of superscript indicator apostrophes (e.g., 10, 10', 10").

In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art. The term "Fig." (whether in all capital letters or not) is used interchangeably with the word "Figure" as an abbreviation thereof in the specification and drawings.

In addition, the sequence of operations (or steps) is not limited to the order presented in the claims unless specifically indicated otherwise.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention. Broken lines in the flow charts represent optional features or steps.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90° or at other orientations) and the spatially relative descriptors used herein interpreted accordingly.

The term "about" refers to numbers in a range of +/−20% of the noted value.

As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. As used herein, the term "and/or" includes any and all combinations of one or more of the associated listed items.

The term "in real-time" means providing an analysis or output of data collected by a non-contact (touchless) sensor system of a circuit interrupter within 1 millisecond ("ms") to five minutes of an arcing event. In contemporary AC circuit breakers, the opening and closing times are in the range of 30-85 ms, out of which the actual arcing time is ½ to 1 cycle of the AC current, i.e., 16 ms in the U.S. with 60 Hz frequency or 20 ms in other countries of the world.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

Figure 2A:
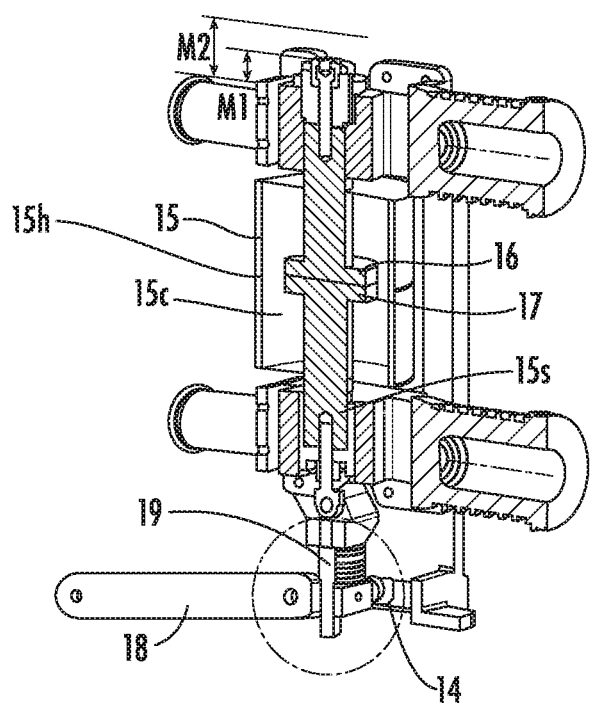
FIG. 2A is a partial section schematic view of another example prior art VI with a WIPE erosion measurement method.
Figure 2B:
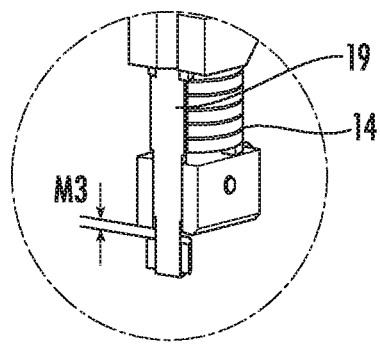
FIG. 2B is an enlarged view of a part of the prior art device shown in FIG. 2A.

Referring to FIGS. 3, 4A, 4B, 5A, and 5B, a circuit interrupter 10 according to exemplary embodiments is shown. The circuit interrupter 10 (also referred to interchangeably as a "circuit breaker") includes a cabinet or main housing 10*h* and a fixed or stationary main contact 16 and a movable contact 17 (FIG. 2A) in the housing 10*h*. The circuit interrupter 10 can include a base 10*b* coupled to wheels 11.

The circuit interrupter 10 can comprise a vacuum interrupter 15 with a vacuum chamber 15*c* provided by a vacuum chamber housing 15*h*. The main contacts 16, 17 can reside in the vacuum chamber 15*c*. The circuit interrupter 10 can include a drive assembly 20, shown as comprising a rod 30 (also known as a mechanism pole shaft connecting rod) of an operating mechanism 31 and a drive member 32 such as a crank (also known as a linkage element). The movable contact 17 can move up and down to an OPEN or CLOSED position based on motion from the drive assembly 20. Other operating mechanism and drive member configurations to move the movable contact 17 may be used. See, for example, U.S. Pat. No. 8,952,826 to Leccia et al. and U.S. Pat. No. 9,378,901 to Ashtekar et al., the contents of which are hereby incorporated by reference as if recited in full herein.

The circuit interrupter 10 can also include a contact spring 35 (also sometimes called "WIPE spring") coupled to the rod 30.

Figure 6:
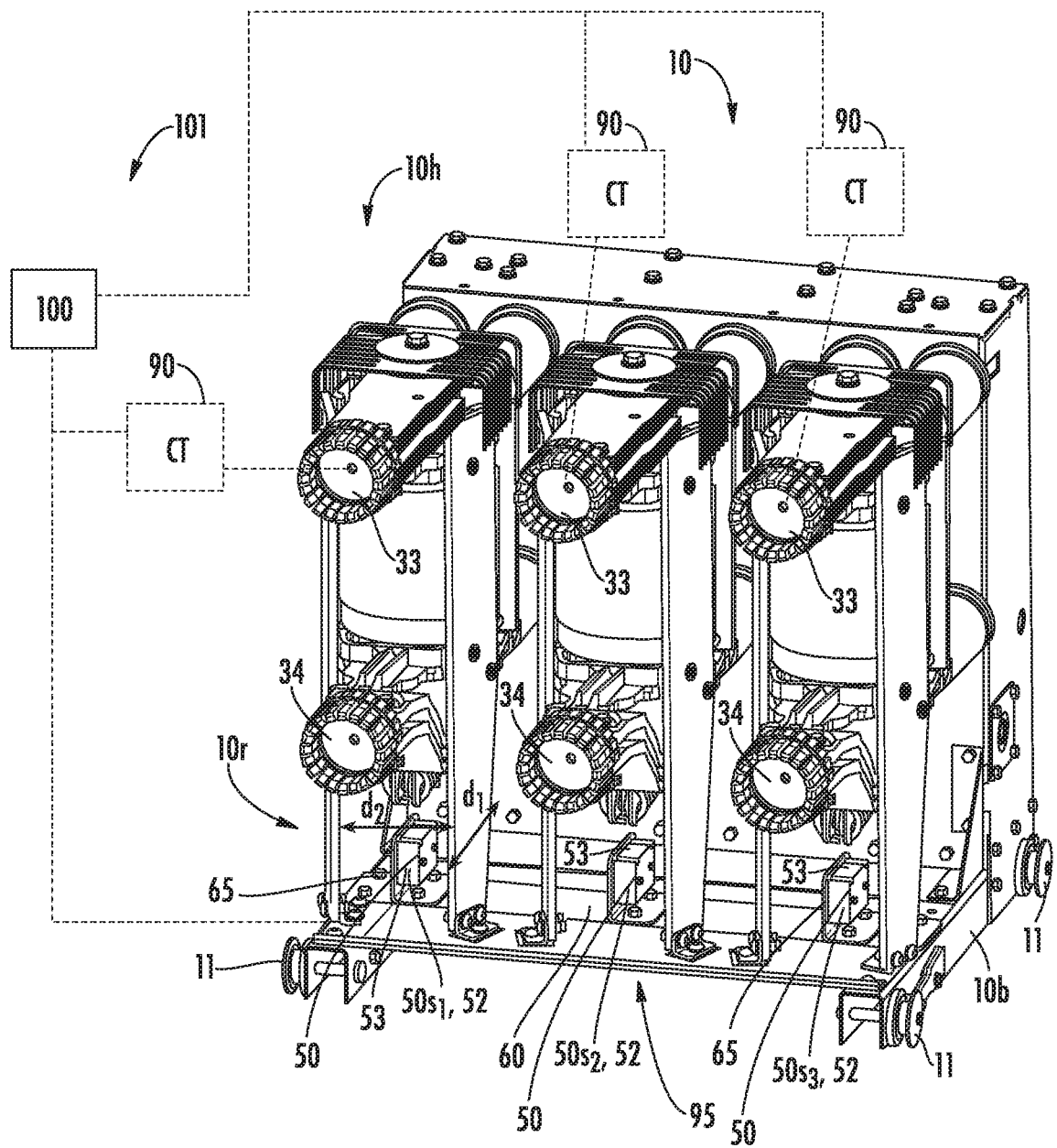
FIG. 6 is a rear perspective view of an example 3-pole circuit breaker with the displacement measurement system according to embodiments of the present invention.

As shown, the circuit interrupter 10 also includes an upper terminal 33 and a lower terminal 34 (typically three parallel and laterally spaced apart upper and lower terminals for a three pole circuit interrupter, FIG. 6).

The movable main contact 17 can comprise an elongate, typically cylindrical, segment that forms a stem 15s. Where a vacuum chamber 15c is used, the stem 15s extends outside the vacuum chamber 15c and the drive assembly 20 is coupled to the movable stem 15s at a location outside the vacuum chamber 15c, spaced apart from the movable contact 17.

The circuit interrupter 10 includes at least one non-contact (non-physical contact or "touchless") measurement sensor and/or displacement sensor 50 such as one or both of an optical or acoustic sensor that transmits and receives a sensor signal. As is known to those of skill in the art, a displacement sensor is a device that measures the distance between the sensor and an object by detecting the amount of displacement through a variety of elements and converting it into a distance. Depending on what element is used, there are several types of sensors, such as optical displacement sensors, linear proximity sensors, and ultrasonic displacement sensors. As also known to those of skill in the art, a measurement sensor is a device that measures by converting changes in amount of light into electrical signals when an object interrupts a wide laser beam. See, http://www.ia.omron.com/support/guide/56/introduction.html, the contents of which are hereby incorporated by reference as if recited in full herein.

The sensor 50 can include an emitter source 50s that transmits a sensor signal across a defined space in the circuit interrupter 10, such as a light source or an acoustic source. The emitter source 50s can comprise a laser 50l as an optical source. The emitter source 50s can comprise an ultrasound source 50u as an acoustic source.

The sensor 50 can be an optical displacement sensor 50 that can be configured to operate using a position sensing device (PSD), charged coupled device (CCD) or complementary method oxide semiconductor (CMOS) type device with triangulation measurement methods.

The sensor 50 can be an ultrasonic displacement sensor where the source 50s emits ultrasonic waves towards or away from a moving component directly or indirectly coupled to the stem 15s. Referring to FIGS. 3, 4A, 4B, 5A and 5B, the emitter source 50s transmits a sensor signal 50b toward an attachment member 40 coupled to the lower end portion of stem 15s and the receiver 52 receives the reflected sensor signal 50b back. When an acoustic sensor is used, the distance can then be calculated by measuring the time required for ultrasonic waves to be sent and received and the speed of sound.

In some embodiments, the sensor 50 can be mounted in the housing 10h and configured to transmit a sensor signal 50b such as a light beam or acoustic waves toward an internal device, optionally the attachment member 40. A receiver sensor 52 can be positioned to receive/detect a transmitted, optionally a reflected, sensor signal 50r such as a reflected light or acoustic signal reflected by an internal device such as the attachment member 40 to provide displacement data useful for assessing erosion of the contact surfaces of the main contacts 16, 17.

The attachment member 40 can be configured to reflect sufficient light or acoustic signal from the emitted respective light beam or acoustic signal 50b to be detectable by the receiver sensor(s) 52. The receiver sensor 52 can be any suitable sensor.

Figure 13A:
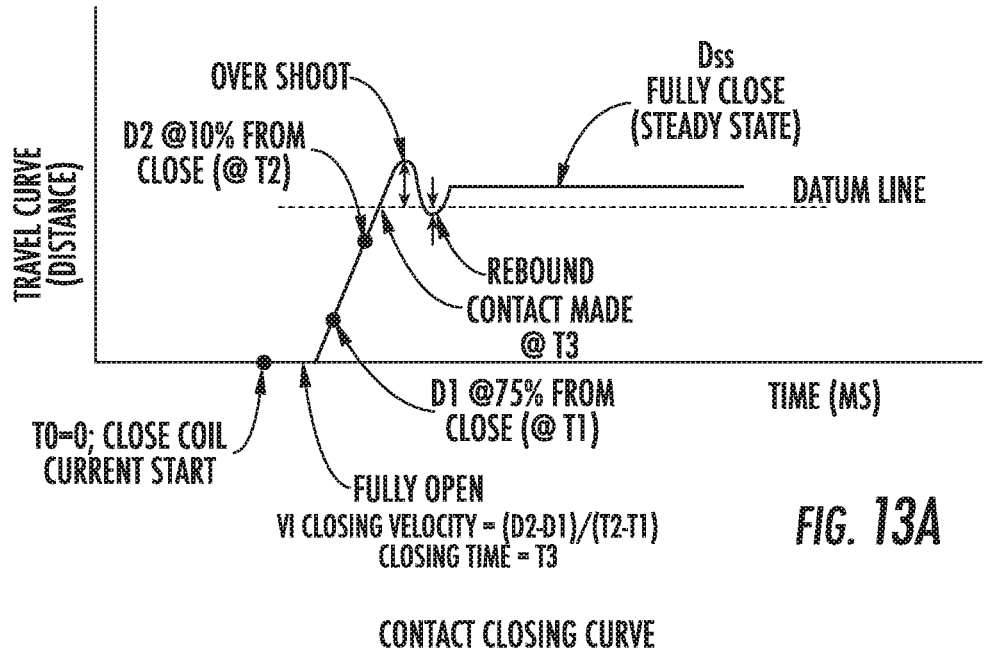
FIG. 13A is a graph of an example travel curve (distance) versus time (ms) of a contact closing curve according to embodiments of the present invention.
Figure 13B:
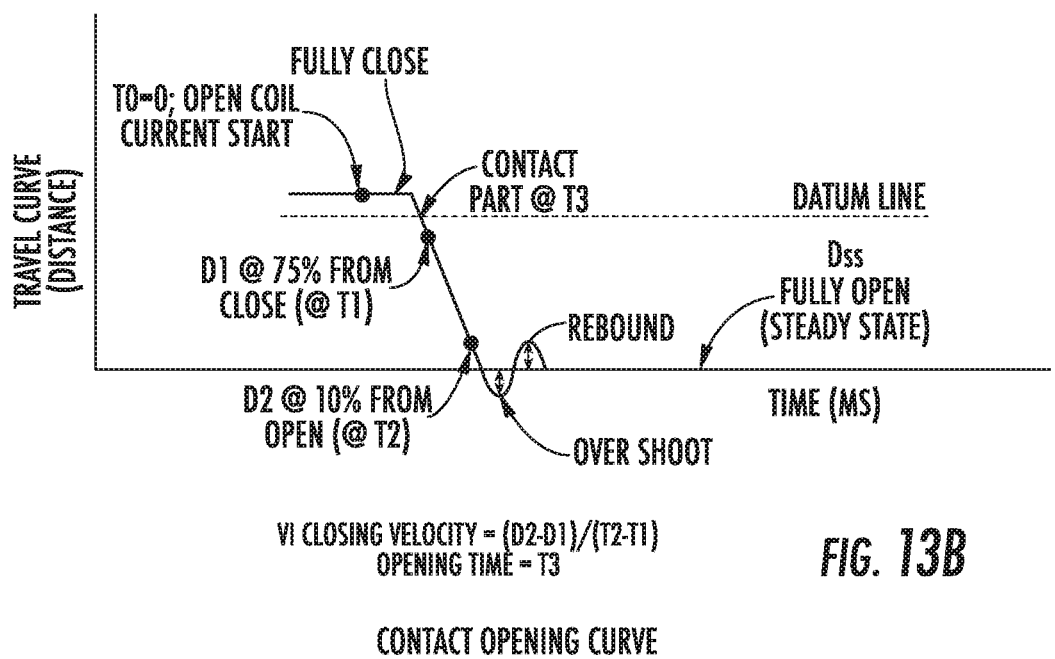
FIG. 13B is a graph of an example travel curve (distance) versus time (ms) of a contact opening curve according to embodiments of the present invention.

During OPEN and CLOSE events, the emitter source 50s can be directed to emit a light beam or acoustic waves 50b, optionally in a pulsed manner, to emit pulses of light or acoustic signal such as ultrasound waves, toward the attachment member 40 and the reflection signal is detected by the receiver sensor 52 to provide stroke data "S" (FIG. 4B, 5B) and/or travel curve displacement data (FIG. 13A, 13B). The data can be evaluated by a processor 100 (FIG. 6, 15) of a control circuit 101 (FIG. 6). As a result, as will be discussed further below, during each interruption when the main contacts 16, 17 separate, the distance traveled by stem 15s and/or drive assembly 20 and the time of such travel can be measured (example distance and time/displacement data are shown in FIGS. 13A, 13B). This displacement data may also be translated to velocity (slope of the distance v. time curve).

Figure 4A:
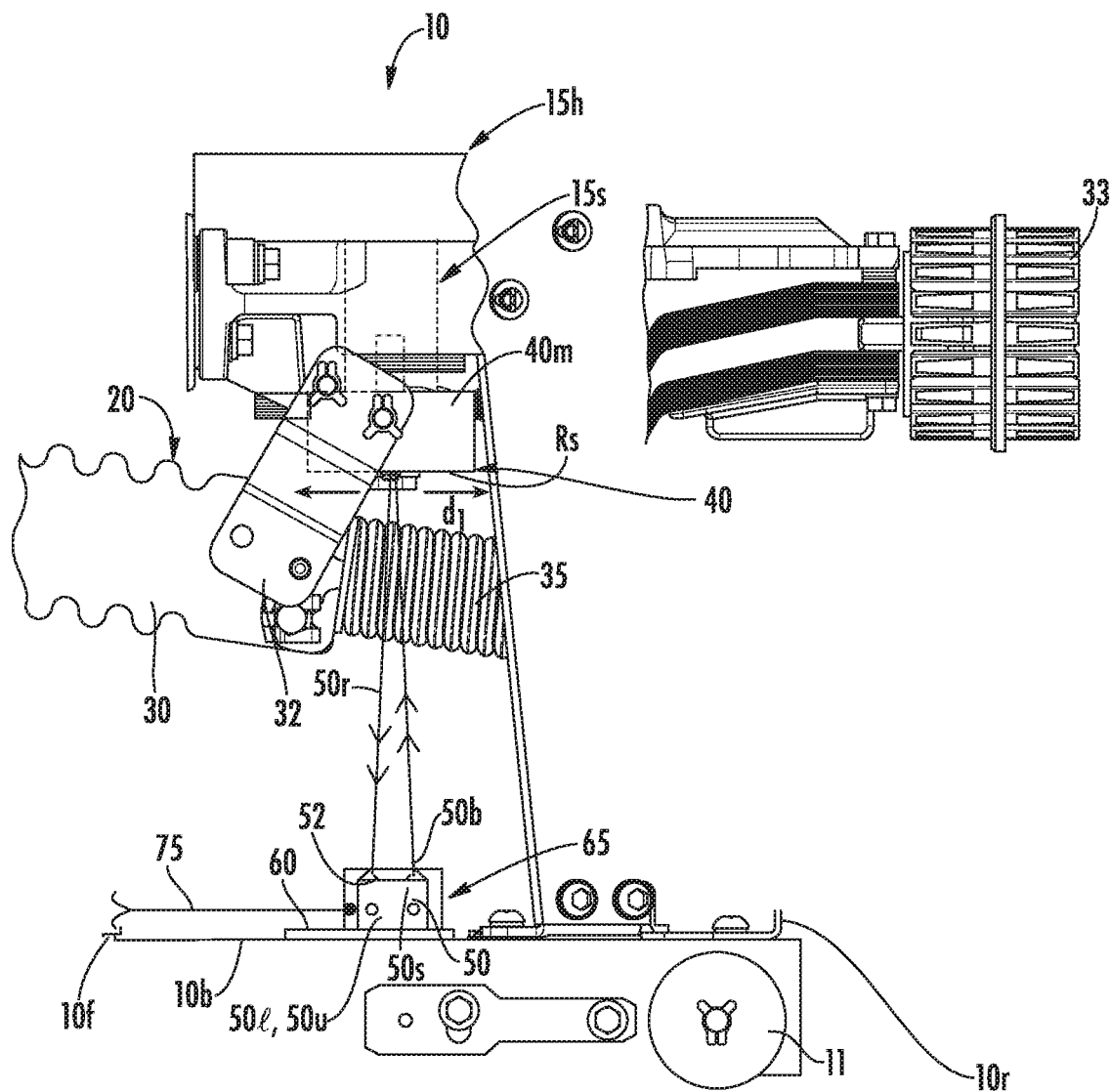
FIG. 4A is an enlarged partial section view of the circuit breaker shown in FIG. 3.
Figure 4B:
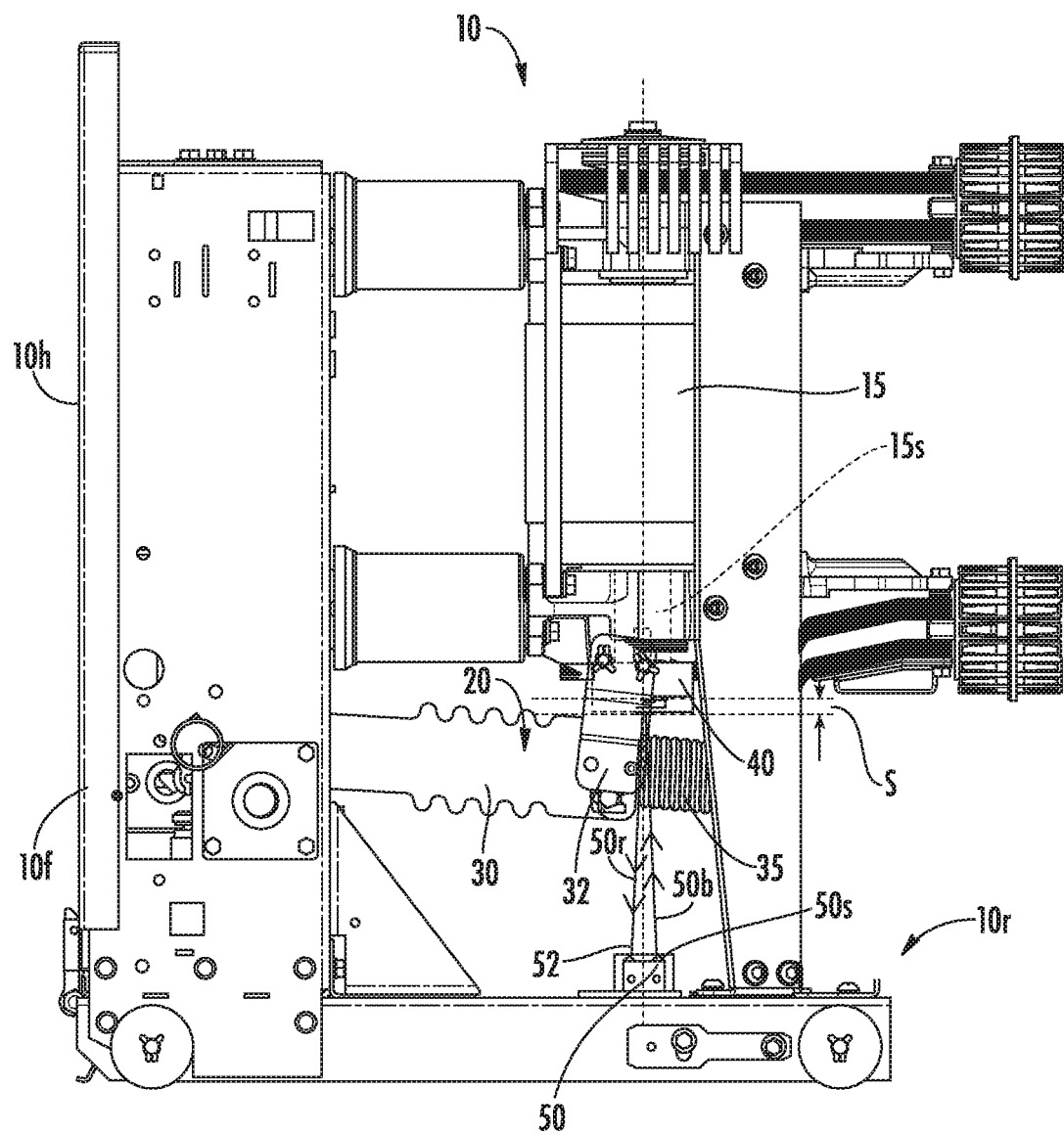
FIG. 4B is a side view of the circuit breaker shown in FIG. 3 in a CLOSED breaker state and illustrating a stroke distance determined based on a non-contact detection stroke measurement system according to embodiments of the present invention.

As schematically shown in FIG. 4A, one or more wiring harness 75 can connect the sensor 50 to a power source, such as to a secondary wiring plug or integral part of secondary contacts/plugs that will communicate the data to the user via secondary connector/plug or specially designed wiring connector (e.g. tertiary plug) or may be plugged to the "plug and play" type communication platform such as, but not limited to, the internet of things (IOT). The emitter/receiver sensors, sensor 50 and 52 may be passive type sensors which may not require external power source to activate and communicate the displacement data to the user. The passive powering can be parasitic powering, inductive or electromagnetic powering or may "piggyback" or engage with onboard power circuits.

Figure 3:
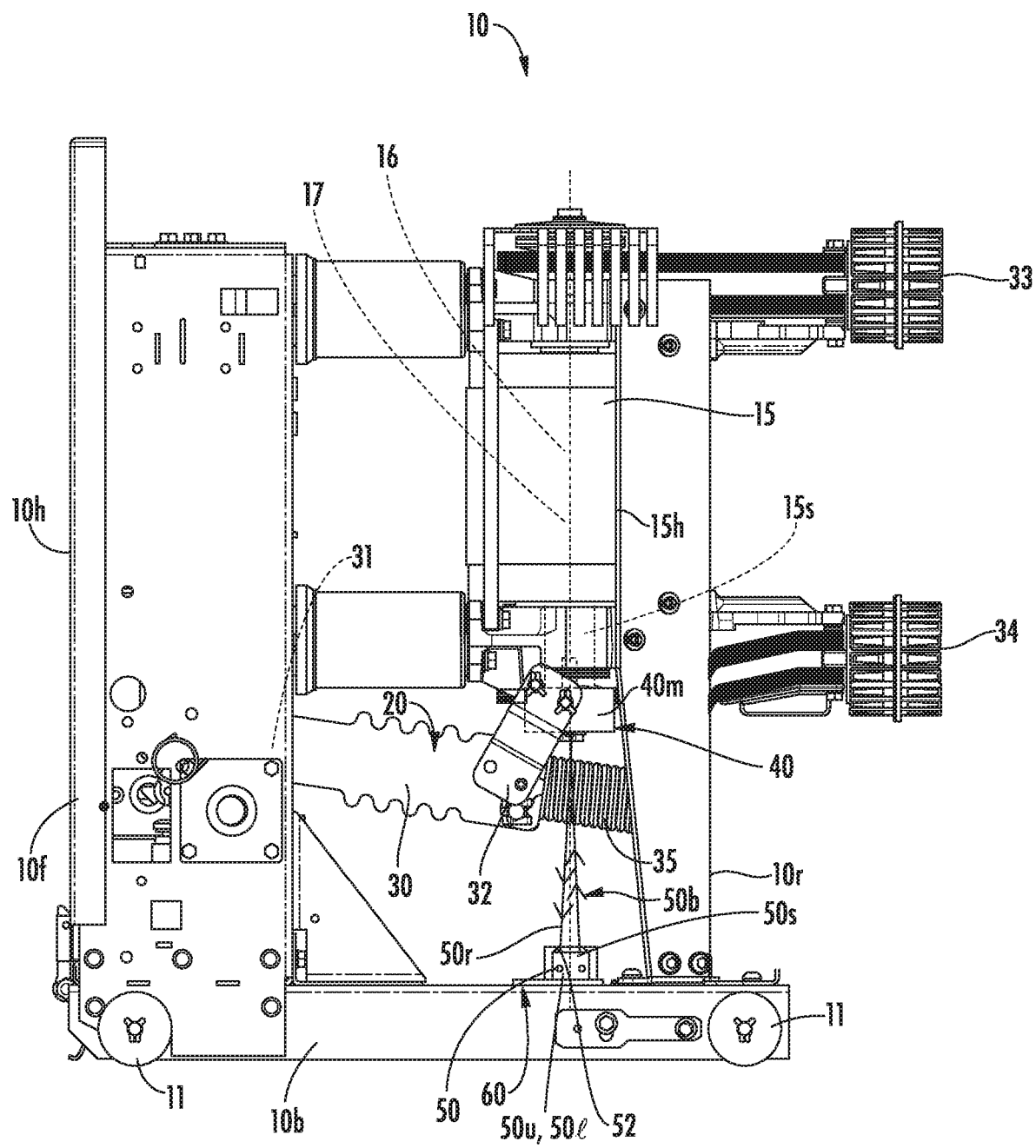
FIG. 3 is a side view of a circuit breaker with a non-contact stroke measurement system according to embodiments of the present invention.
Figure 7:
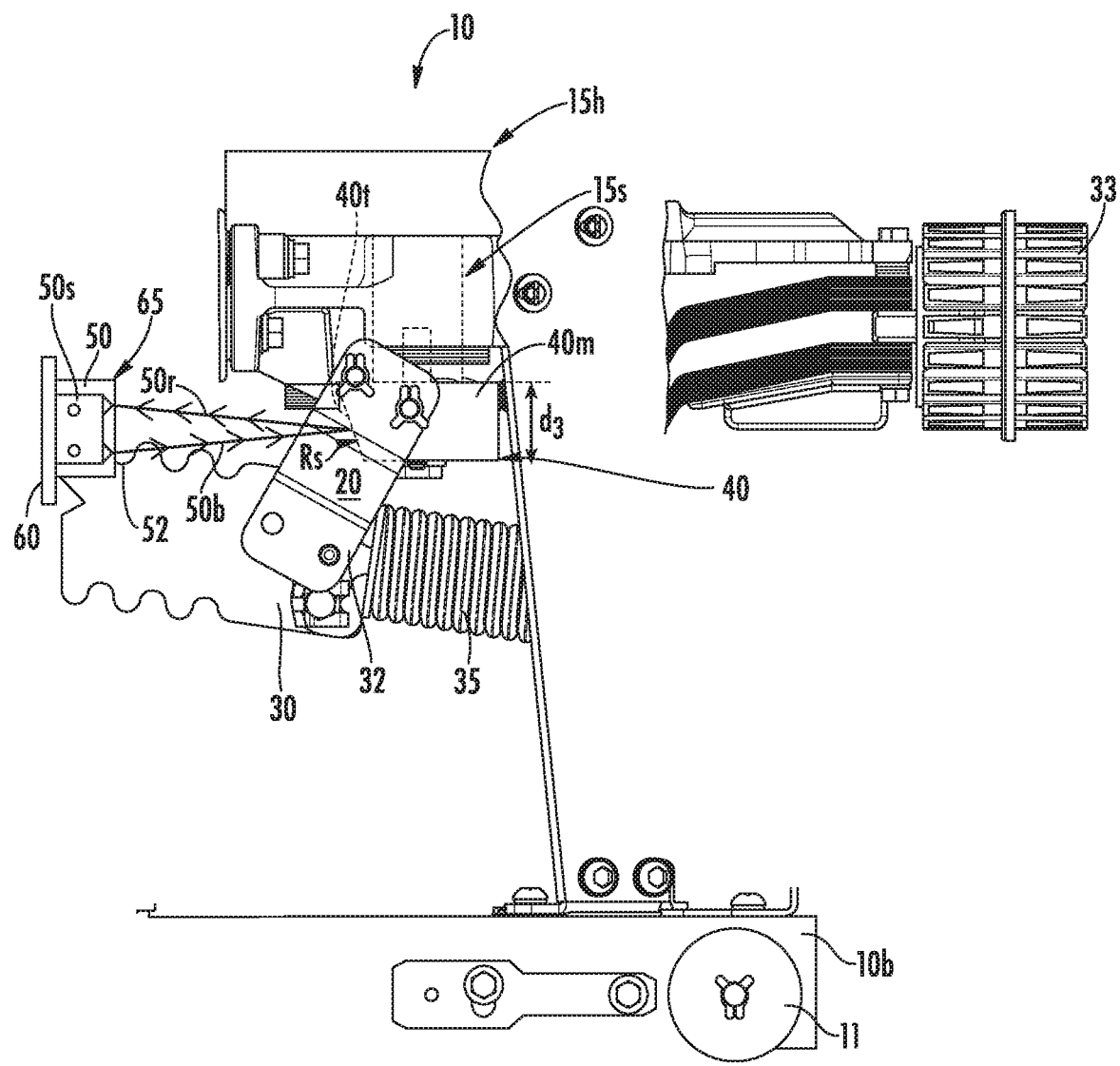
FIG. 7 is an enlarged partial section view of another embodiment of a circuit breaker with a displacement measurement system according to embodiments of the present invention.

In some embodiments, the sensor 50 has a unitary body or compact housing 50h and comprises both the emitter source 50s and the receiver sensor 52 (FIG. 10) and can be attached to a stationary support such as the chassis of the base 10b as shown in FIG. 3 or a bracket coupled to an internal structure of the housing 10h as shown in FIG. 7.

Figure 8A:
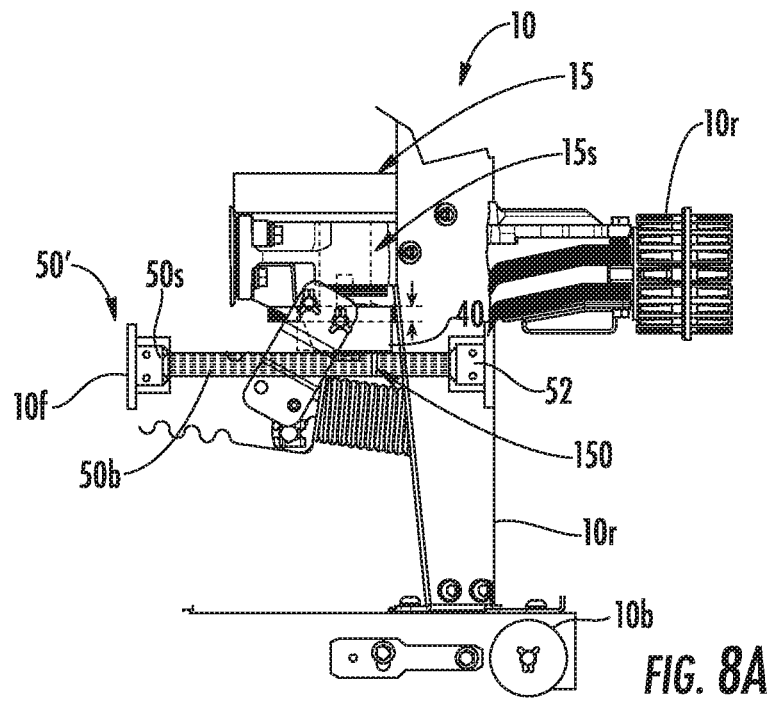
FIG. 8A is a partial side view of a circuit breaker with a non-contact sensor system with separate cooperating emitter and receiver components according to embodiments of the present invention.
Figure 9A:
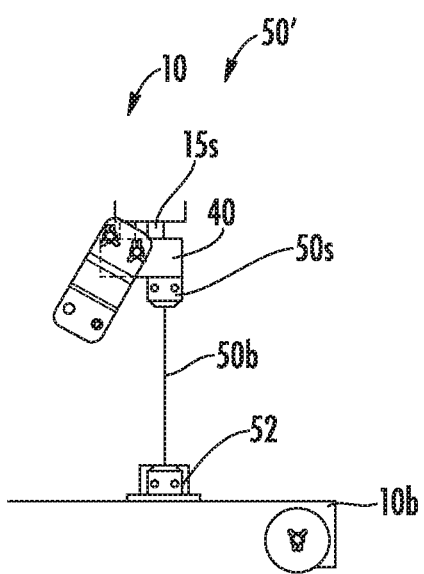
FIG. 9A is a partial side view of a circuit breaker with a non-contact sensor system with separate cooperating emitter and receiver components according to other embodiments of the present invention.
Figure 9B:
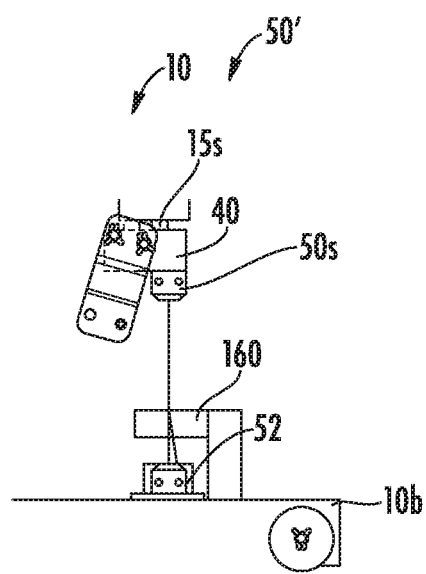
FIG. 9B is a partial side view of a circuit breaker with a non-contact sensor system with separate cooperating emitter and receiver components according to other embodiments of the present invention.

In other embodiments, the sensor 50 provides the emitter source 50s and receiver sensor 52 as separate cooperating components as shown, for example, in FIGS. 8A, 9A and 9B.

As discussed above, in some embodiments, the at least one attachment member 40 can be directly or indirectly coupled to a respective stem 15s. For example, as shown in FIGS. 3, 4A, 4B, 5A and 5B, the at least one attachment member 40 is directly coupled to the stem 15s. However, the at least one attachment member 40 can be indirectly coupled to the stem 15s and attached to any component that has direct or indirect motion associated with the motion of the movable stem 15s that moves to OPEN and CLOSED positions. These include mechanism components, the drive assembly 20, such as rod 30 or crank 32, where used. Thus, the attachment member 40 can move in concert with the stem 15s and the sensor 50 can provide displacement data. Then, the actual stroke and wear data can be calculated by simply considering the mechanical linkages and leverage ratios.

As shown in FIG. 3, the at least one attachment member 40 can have a rigid three-dimensional shaped body 40m configured with a longitudinally extending aperture or channel 42 (FIG. 9) sized and configured to receive a portion of the stem 15s. The channel 42 can be a through channel or may have a closed end.

The three-dimensional shaped body 40m can be configured with at least one reflector surface Rs. The reflector surface Rs can be provided as a reflective coating, film or adhesively attachable badge or strip 40' (FIG. 9) that can be (optionally conformably) attached directly to an outer surface of the stem 15s or drive assembly 20 or to the attachment member 40. Components or surfaces adjacent the reflector surface Rs of the attachment member 40 may be configured with a lower reflectivity or reflectance than the reflectivity or reflectance of the reflector surface Rs.

Referring to FIGS. 3, 4A, 4B, 5A, 5B and 11, the aperture or channel 42 of the attachment member 40 can reside laterally centered in a first direction "d1" associated with a direction extending between the front 10f and rear 10r of the housing 10h. The attachment member 40 can have a width that is greater than a width of the stem 15s, in the first direction d1 and/or in a second direction d2, with the second direction perpendicular to the first direction d1 and extending side-to-side direction of the housing 10h (FIG. 4) or an up-and-down in the housing 10h (FIG. 7). The attachment member 40 can provide an enlarged reflection surface(s) Rs. The end portion of the stem 15s may extend out of a lower end of the aperture or channel 42 of the attachment member 40.

In some embodiments, the attachment member 40 can define at least one planar reflection surface Rs that faces the emitter source 50s that may be patterned or polished. Reflectivity is an optical property of material, which describes how much light is reflected from the material in relation to an amount of light incident on the material. Polished metals can reflect light specularly with great efficiency, for example aluminum or silver. The measure of the capability of a body to reflect the optical radiation is given by a quantity called reflectance. The reflectance indicates the proportion of incident light that a given surface is capable to reflect, assessed per each wavelength, and, thus it is represented by the ratio of the intensity of reflected radiant flux to that of incident radiant flux under specified conditions of irradiation. A uniform surface reflectivity can provide accurate, consistent and reliable measurements in a PSD method. CMOS and CCD methods are typically not susceptible to the variation in the surface color and texture or reflectivity.

Figure 10:
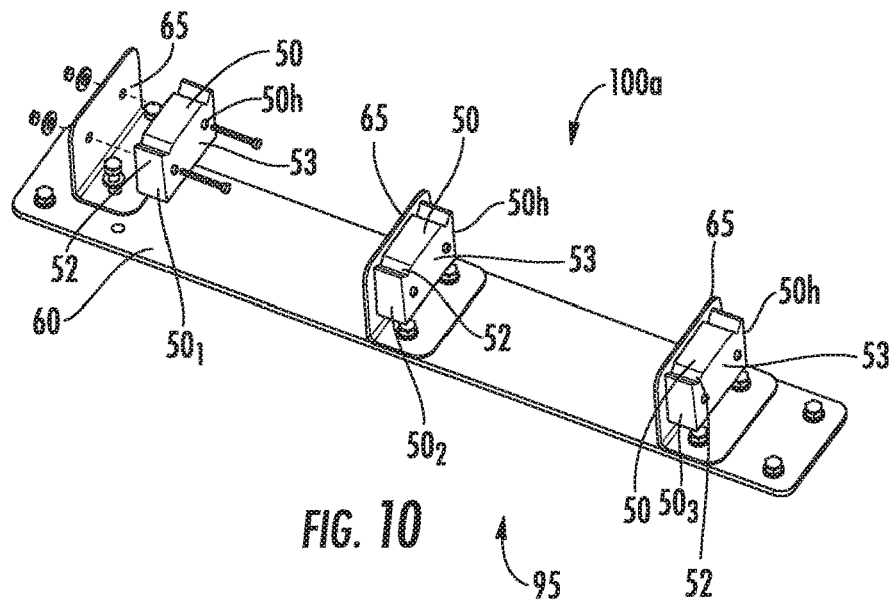
FIG. 10 is a side perspective view of an example displacement stroke measurement assembly according to embodiments of the present invention.

Referring to FIGS. 6 and 10, the circuit interrupter 10 with the erosion monitoring sub-assembly 95 can be mounted in the housing 10h, typically at a rear 10r of the housing 10h. As shown in FIG. 6, a laterally extending mounting bracket 60 holds a plurality of sensors 50 with respective emitter sources 50s and receivers 52. Each receiver and emitter pair 53 of a respective sensor 50 can be aligned under respective terminals 33, 34 of a respective pole. As shown in FIG. 10, there are three sensors 50 with emitter sources $50s_1$, $50s_2$, $50s_3$ and respective receivers 52. Each emitter and receiver pair 53 can be held in a housing 50h and attached by an L-shaped mounting bracket 65 to the laterally extending bracket 60.

Referring again to FIG. 6, a processor 100 can be coupled to a current transformer 90 mounted on the primary stab (not shown) and also coupled to each receiver 52 and emitter 50 to be able to measure current simultaneously with obtaining the displacement data and/or stroke signal.

FIG. 7 illustrates that the emitter source 50s and receiver 52 can be mounted above the base 10b and configured to project the light or acoustic signal 50b inward toward a rear 10r of the housing 10h instead of upward as shown in FIGS. 3, 5A, 5B. The attachment member 40 is shown as comprising the shaped body 40m and that has a tapered wall 40t facing the emitter source and receiver 50s, 52. The tapered wall 40t can define the reflector surface Rs. As shown, the tapered wall 40t can be angled to have a larger upper end than lower end.

Figure 8B:
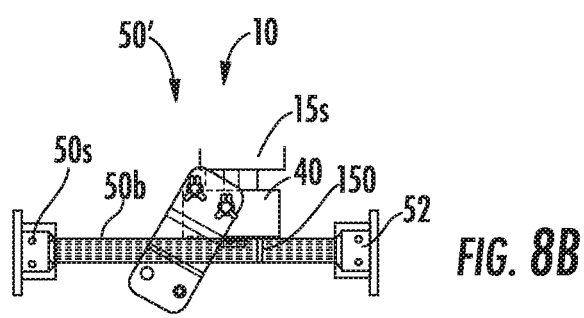
FIG. 8B illustrates the sensor system of FIG. 8A with the breaker in an OPEN position.
Figure 8C:
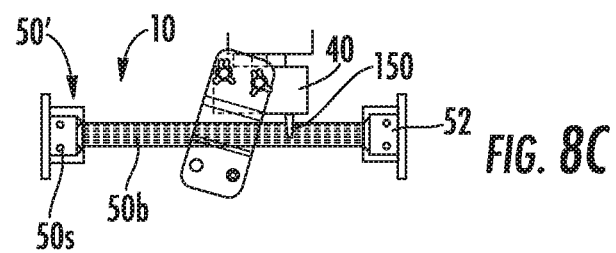
FIG. 8C illustrates the sensor system of FIG. 8A with the breaker in a CLOSED position.

FIGS. 8A-8C illustrate that the sensor 50' can provide the receiver 52 and emitter source 50s as separate cooperating components, both of which can be mounted to be stationary in the circuit breaker housing 10h, facing each other. As shown, the emitter source 50s is closer to the front 10f than the receiver 52. The emitter source 50s can be on one side of the stem 15s and the receiver 52 on the other, spaced apart across a width of the stem 15s (in a front 10f to back 10r direction of the breaker 10). The attachment member 40 can include a projection member 150 that can move in concert with the stem 15s and relative to the emitted signal 50b.

FIG. 8B illustrates the position of the projection member 150 with the breaker 10 in an OPEN position while FIG. 8C illustrates the position of the projection member with the breaker 10 in the CLOSED position. As shown, the projection member 150 can extend across the entire span of the emitted signal 50b when the breaker 10 is in an OPEN position and only partially occlude the signal 50b when in the CLOSED position. However, the projection member 150 can be configured to partially occlude the signal 50b when the breaker is OPEN and reside above the signal 50b when in the CLOSED position. The position of the projection member 150 relative to the emitted signal 50b varies the received signal, such as via doppler sensing and modulation of ultrasound wave or by a light disruption or change for a light sensor.

In some embodiments, the sensor 50' shown in FIG. 8A-8C can operate similar to a "Laser Scanning Method" which is known to those of skill in the art whereby the sensor performs measurements by emitting a laser beam while scanning a small diameter laser beam from the emitter. The sensor 50' can measure the time and/or portion of the beam that an object (projection member 150) blocks the beam which can provide displacement data.

FIGS. 9A and 9B also illustrate that the sensor 50' can provide the receiver 52 and emitter source 50s as separate cooperating components. In this embodiment, the emitter source 50s can be coupled directly to the VI stem 15s or to the attachment member 40 that can be coupled to the VI stem 15s and can move in concert with the stem 15s. The receiver 52 can be mounted on a stationary support, shown as a chassis of the base 10b.

Where an acoustic source such as an ultrasound source is used as the emitter source 50s to emit the sensor signal 50b, a Doppler-affect producing a change in wavelength can be used to determine displacement data.

Where a light source is used as the emitter source 50s to emit the sensor signal 50b, the circuit breaker 10 can also position an optical lens 160 such as a crystal in the beam path 50b to cause the light signal emitted to alter light direction as it travels toward the receiver 52 depending on the position of the emitter source 50s. The change in direction of the light signal can be used to measure displacement. In some embodiments, the displacement can be measured along the lines of the principle of the PSD method.

Figure 11:
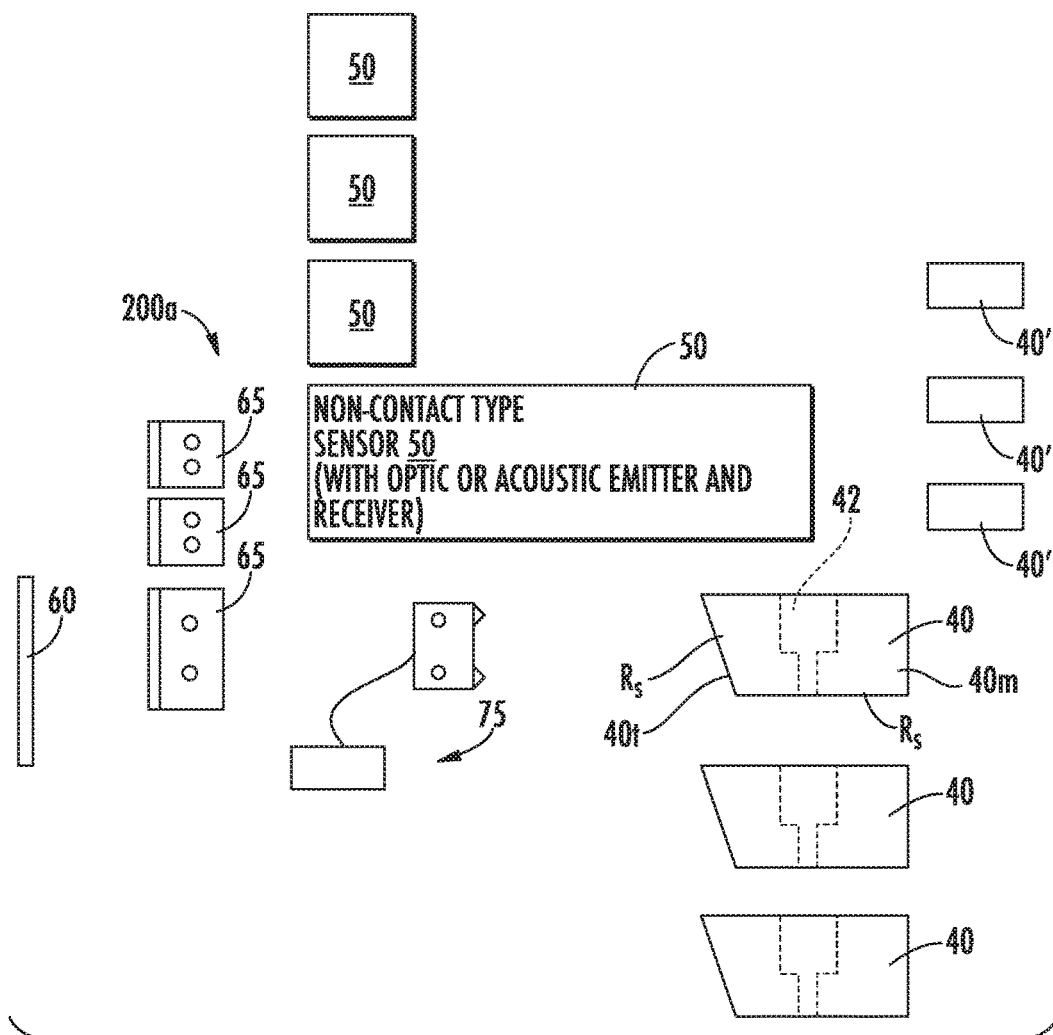
FIG. 11 is a schematic illustration of a field retrofit kit with displacement measurement components according to embodiments of the present invention.

FIG. 11 illustrates a kit 200 of components that can be used for field retrofit of current interrupters 10 according to embodiments of the present invention. As shown, the kit 200 includes an installation frame 60, a plurality of mounting brackets 65, a plurality of emitter/receivers 50, 52, a plurality of attachment members 40 and/or reflectors 40' and an optional tertiary wire plug with wiring harness 75 to be connected to secondary wiring plug or integral part of secondary contacts/plug. The parts of the kit 200 can be provided as separate parts, can be provided as partially assembled parts, or can be provided in the kit package as assembled into the sub-assembly 95 shown in FIG. 10.

Figure 12:
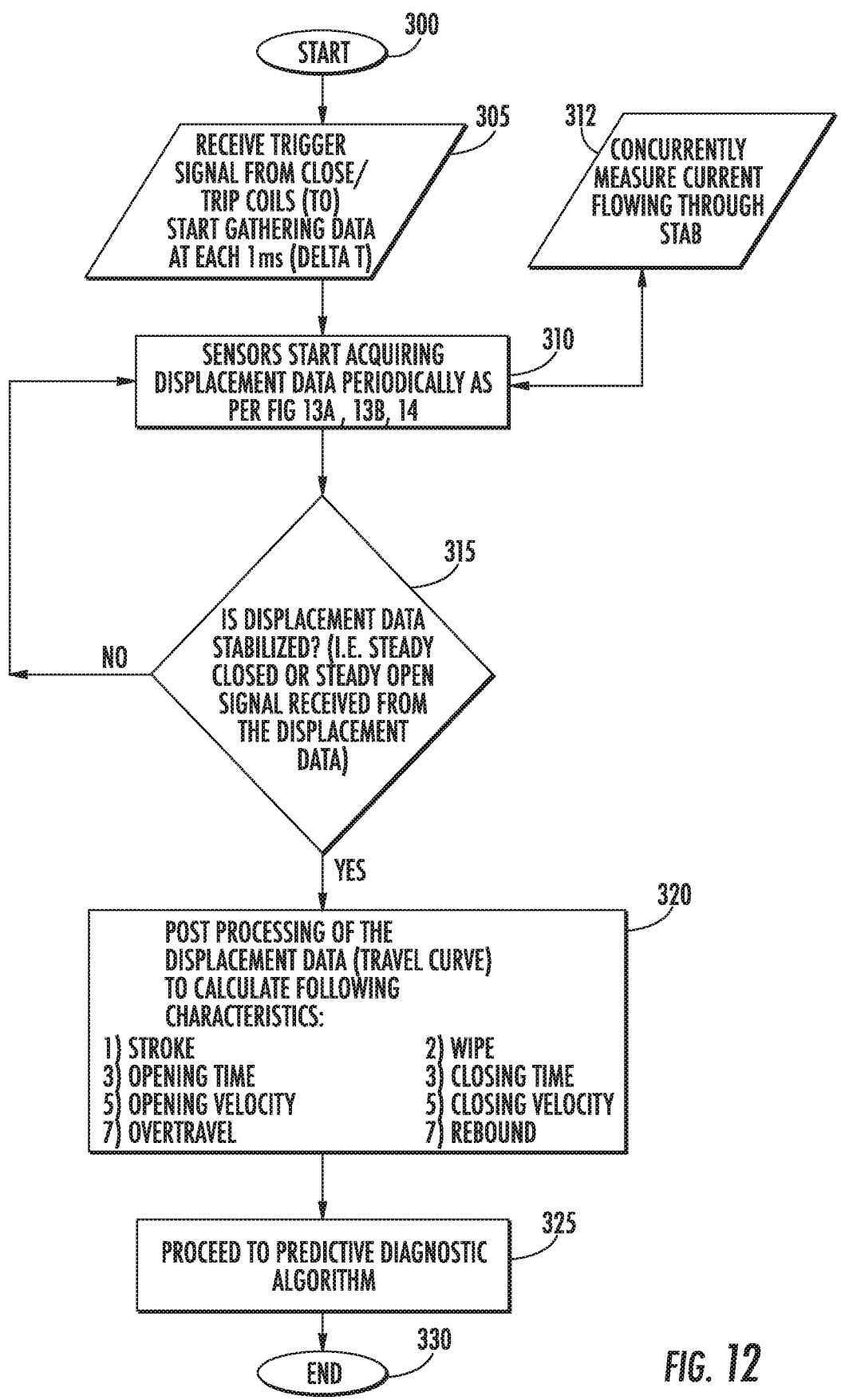
FIG. 12 is a flow chart of example actions that can be used to carry out embodiments of the present invention.

FIG. 12 illustrates example actions that can be carried out for evaluating erosion status of the main contacts and/or provide a recommended future maintenance/service advised timeline. A trigger signal is received from close trip coils to initiate gathering data (block 305). The trigger signal can direct the sensor 50 to acquire data at defined successive intervals "ΔT" (block 310). The intervals can be constant or irregular during an opening or closing event. Typically, the data acquisition interval is greater than 20 μs and less than 3 ms, such as every 50 μs to every 2 milliseconds, typically about every 1 ms or about every 2 ms. The signal can be acquired by the sensor 50 (sensor receiver 52) until displacement data is stabilized (i.e., steady state in the open state or closed state) (block 315).

Electric current signal flowing through a respective stab/current transformer can be concurrently measured with the displacement data acquisition (block 312). Current for short circuit (SC) and continuous current conditions have various ratings and the number of SC events can impact erosion and electrical switching life of the circuit breaker.

Table 1 illustrates the real-time calculation of remaining electrical switching life (operation) based on erosion, WIPE and interrupt current (kA, rms) measured at each operational arcing event (OPEN, CLOSE, SHORT).

T0=0; when control signal current starts to flow via close coil, and is being used as the trigger to acquire displacement data from sensors 50. D1@75% from close at T1. D2@10% from close at T2 and T3 contact made, followed by overshoot and rebound, then steady state. Stroke is the distance at the right at steady state. WIPE is the distance above the datum line at steady state.

FIG. 13B illustrates T0, T1, T2 and T3 time points for various events followed by a fully close (steady state) condition below the datum line. T0=0; open coil, current start. D1@75% from close at T1. D2@10% from open at T2. T3=opening time. T3 contact made, followed by overshoot and rebound, then steady state at fully open. The opening velocity=(D2−D1)/(T2−T1).

Figure 14:
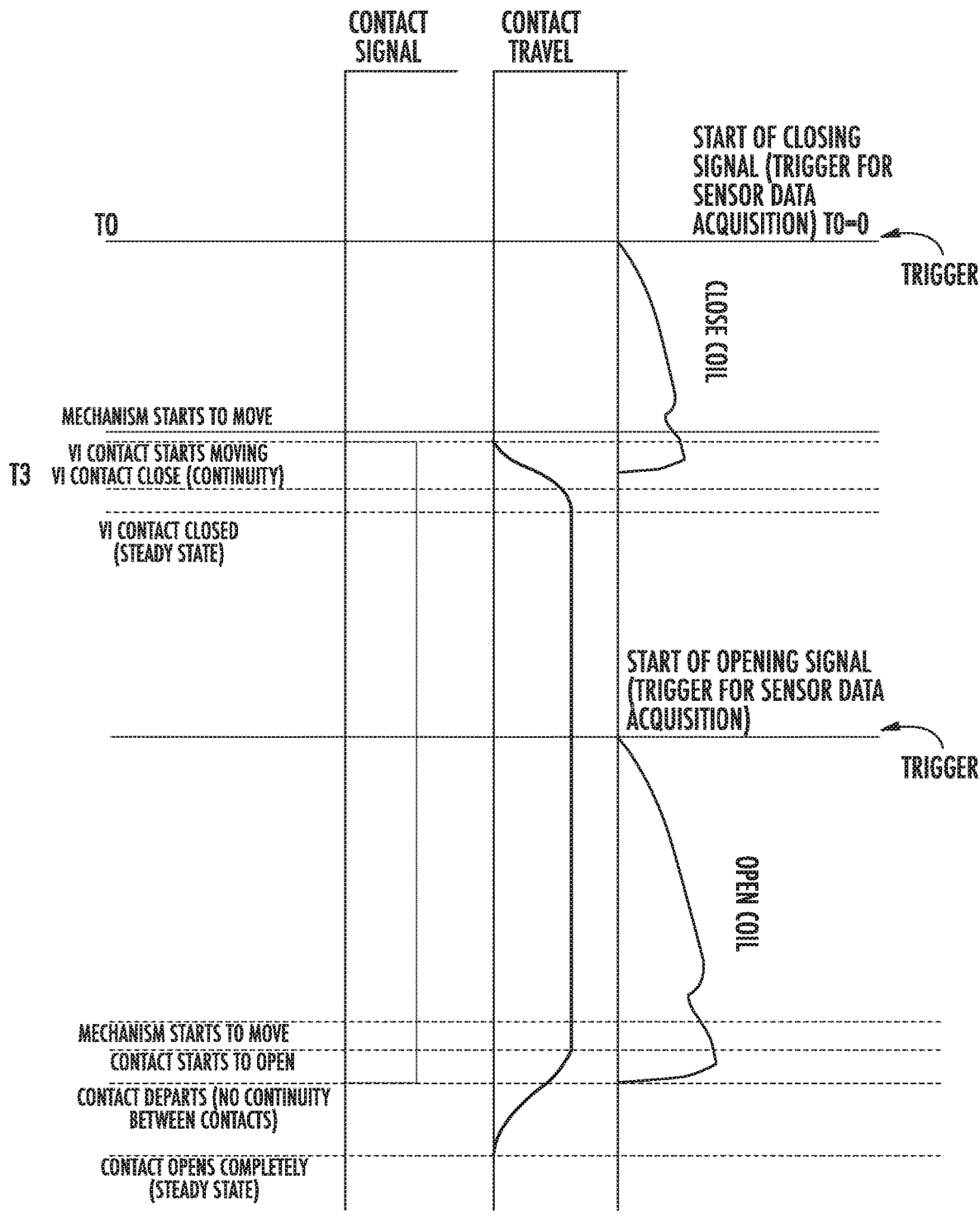
FIG. 14 is a timing diagram of a data acquisition protocol and trigger start for various time points of contact travel/contact signal according to embodiments of the present invention.

FIG. 14 is a data acquisition protocol for obtaining displacement data for the travel curves of FIGS. 13A and 13B with example trigger points, T0 to direct the sensor to acquire data based on the reflected light beam signal. The contact travel signal is noted at each closing operation by storing displacement of every steady state displacement amplitude (Dss(i)—where i=number of closing operation). Comparing the Dss of each consecutive closing operations provide the erosion of the contacts 16, 17:

Erosion between $i^{th}$ and $(i+1)^{th}$ operation=Dss(i)−Dss(i+1).

Similarly, the wipe can be calculated as: Dss(i)−D3(i).

Note that the D3 and T3 measurements may also be performed when circuit breaker is in diagnostic mode so that electric arc is not formed between contact 16 and 17. Under service mode, the D3 and T3 measurements may be erroneous due to first electrical arc signal.

TABLE 1

VI type WL-36109
Rated Short circuit current 80
Rated Continuous current 4000
Factory set Stroke reading 0.5
Allowable erosion 0.125
Rated SC operations 75 Forecast (# of ops @kA)

| Op # | Stroke (inch) | Wipe (inch) | Erosion (inch) | Interr. current (kA) | 4 kA | 20 kA | 40 kA | 60 kA | 80 kA |
|---|---|---|---|---|---|---|---|---|---|
| 001 | 0.5 | 0.2 | 0 | 2 | 9125 | 1168 | 292 | 129 | 73 |
| 002 | 0.5 | 0.2 | 0 | 1.5 | 9125 | 1168 | 292 | 129 | 73 |
| 003 | 0.5 | 0.19 | 0 | 10 | 9125 | 1168 | 292 | 129 | 73 |
| 004 | 0.495 | 0.19 | 0.005 | 2 | 8750 | 1120 | 280 | 123 | 70 |
| . | . | . | . | . | . | . | . | . | . |
| . | . | . | . | . | . | . | . | . | . |
| 150 | 0.4 | 0.18 | 0.1 | 2 | 1750 | 224 | 56 | 24 | 14 |

Referring again to FIG. 12, the displacement data (travel curve) can be processed to calculate characteristics such as stroke, WIPE, opening time, closing time, opening velocity, closing velocity, over travel and rebound (block 320). A predictive diagnostic or useful end of life estimate algorithm can be carried out based on one or more of the calculated characteristics (block 325).

FIGS. 13A and FIG. 13B illustrate contact closing and opening graphs (travel curves) of distance versus time (ms). FIG. 13A illustrates T0, T1, T2 and T3 time points for various events followed by a fully close (steady state) condition above a datum line. The closing velocity can be calculated as (D2−D1)/(T2−T1). T3 is the closing time.

Figure 15:
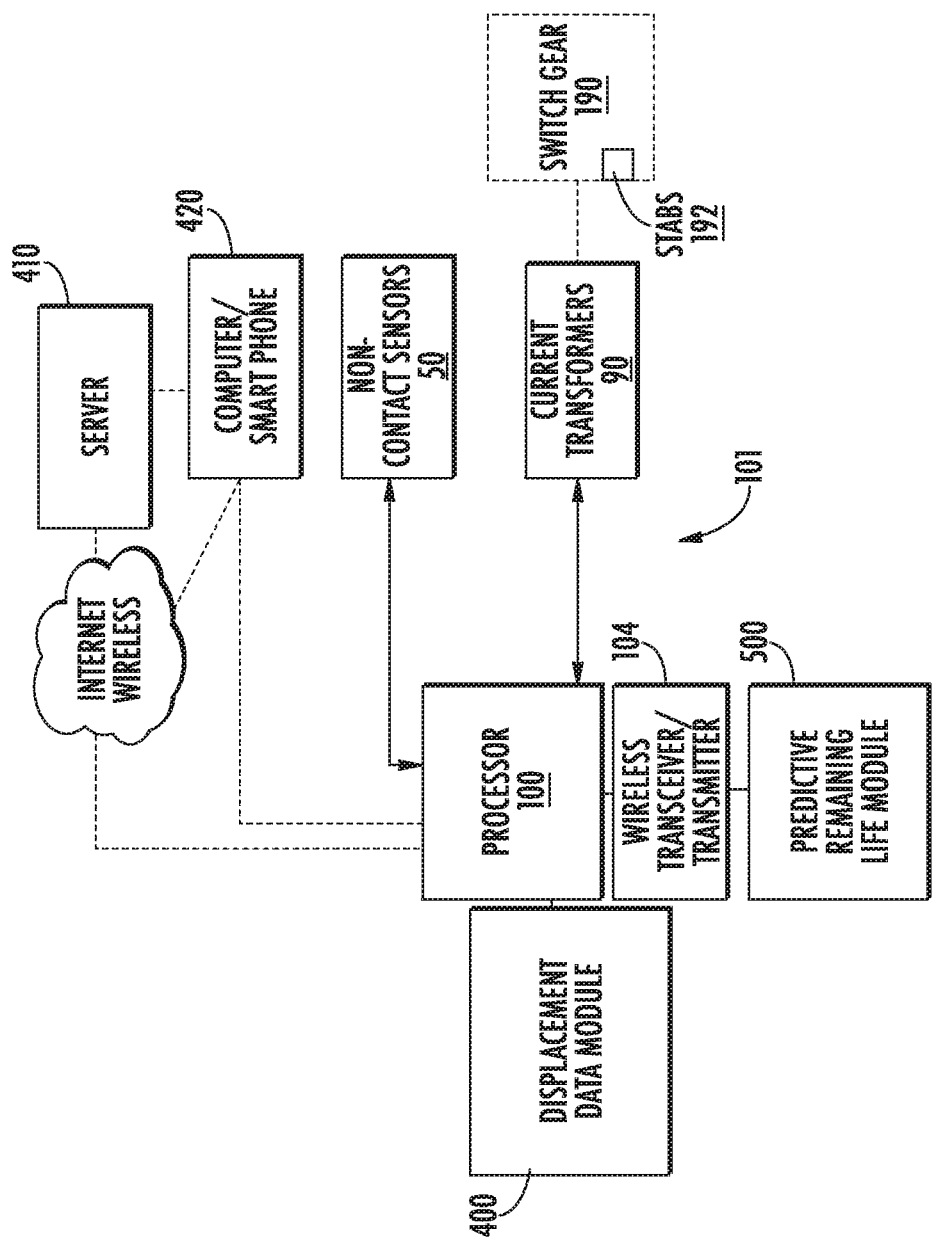
FIG. 15 is a block diagram of a circuit for analyzing displacement data provided by the onboard non-contact sensors using a module according to embodiments of the present invention.

FIG. 15 is a schematic illustration of a control circuit 101 for a circuit interrupter 10. The control circuit 101 can include at least one processor (i.e., digital signal processor) 100 and can include a wireless transceiver 104. The processor 100 can include or be in communication with a displacement data module 400 (for erosion and wipe monitoring). The processor 100 can include or be in communication with a predictive remaining life module 500 that can be updated in real-time (i.e., five minutes or less than five minutes) from each opening, closing or shorting event. The control circuit 101 can be integrated into a respective current interrupter 10 or be distributed across multiple locations such as via the internet to a remote server 410, computer or smartphone

420. The processor 100 can be in communication with the sensors 50 as well as current transformers 90 that can engage stabs 192 of switchgears 190 to measure current occurring during an opening, closing or shorting event, for example.

The control circuit 101 can generate an output resulting in a visual output to a smartphone, computer or display or audible output via speaker on the circuit interrupter so that maintenance and/or corrective action can be taken. The output can be in response to electronically automatically determining that the degree of erosion has reached a defined undesirable level or based on a predicted time point as to when this will happen based on measurements of stroke or other displacement data for a most recent or present opening, closing or shorting event.

The modules 400, 500 can be onboard the circuit interrupter 10 or distributed in one or more servers 410. The server 410 may be embodied as a standalone server or may be contained as part of other computing infrastructures. The server 410 may be embodied as one or more enterprise, application, personal, pervasive and/or embedded computer systems that may be standalone or interconnected by a public and/or private, real and/or virtual, wired and/or wireless network including the Internet, and may include various types of tangible, non-transitory computer-readable media. The server 410 may also communicate with the network via wired or wireless connections, and may include various types of tangible, non-transitory computer-readable media.

The server 410, where used, can be provided using cloud computing which includes the provision of computational resources on demand via a computer network. The resources can be embodied as various infrastructure services (e.g., compute, storage, etc.) as well as applications, databases, file services, email, etc. In the traditional model of computing, both data and software are typically fully contained on the user's computer; in cloud computing, the user's computer may contain little software or data (perhaps an operating system and/or web browser), and may serve as little more than a display terminal for processes occurring on a network of external computers. A cloud computing service (or an aggregation of multiple cloud resources) may be generally referred to as the "Cloud". Cloud storage may include a model of networked computer data storage where data is stored on multiple virtual servers, rather than being hosted on one or more dedicated servers.

The processor 100 can communicate with the server 410 or computer or smartphone 420 via a transceiver 104 and/or a computer network or cellular network. For the computer network, this can comprise one or more of local area networks (LAN), wide area networks (WAN) and can include a private intranet and/or the public Internet (also known as the World Wide Web or "the web" or "the Internet."

Embodiments of the present invention may include or take the form of a software embodiment or an embodiment combining software and hardware aspects, all generally referred to herein as a "module." Furthermore, the present invention may take the form of a computer program product on a (non-transient) computer-usable storage medium having computer-usable program code embodied in the medium. Any suitable computer readable medium may be utilized including hard disks, CD-ROMs, optical storage devices, a transmission media such as those supporting the Internet or an intranet, or magnetic storage devices. Some circuits, modules or routines may be written in assembly language or even micro-code to enhance performance and/or memory usage. It will be further appreciated that the functionality of any or all of the program modules may also be implemented using discrete hardware components, one or more application specific integrated circuits (ASICs), or a programmed digital signal processor or microcontroller. Embodiments of the present invention are not limited to a particular programming language.

Computer program code for carrying out operations of data processing systems, method steps or actions, modules or circuits (or portions thereof) discussed herein may be written in a high-level programming language, such as Python, Java, AJAX (Asynchronous JavaScript), C, and/or C++, for development convenience. In addition, computer program code for carrying out operations of exemplary embodiments may also be written in other programming languages, such as, but not limited to, interpreted languages. Some modules or routines may be written in assembly language or even micro-code to enhance performance and/or memory usage. However, embodiments are not limited to a particular programming language. As noted above, the functionality of any or all of the program modules may also be implemented using discrete hardware components, one or more application specific integrated circuits (ASICs), or a programmed digital signal processor or microcontroller. The program code may execute entirely on one (e.g., a workstation) computer, partly on one computer, as a stand-alone software package, partly on the workstation's computer and partly on another computer, local and/or remote or entirely on the other local or remote computer. In the latter scenario, the other local or remote computer may be connected to the user's computer through a local area network (LAN) or a wide area network (WAN), or the connection may be made to an external computer (for example, through the Internet using an Internet Service Provider).

The present invention is described in part with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing some or all of the functions/acts specified in the flowchart and/or block diagram block or blocks.

The flowcharts and block diagrams of certain of the figures herein illustrate exemplary architecture, functionality, and operation of possible implementations of embodiments of the present invention. In this regard, each block in the flow charts or block diagrams represents a module, segment, or portion of code, which comprises one or more executable instructions for implementing the specified logical function(s). It should also be noted that in some alternative implementations, the functions noted in the blocks may occur out of the order noted in the figures. For example, two blocks shown in succession may in fact be executed substantially concurrently or the blocks may sometimes be executed in the reverse order or two or more blocks may be combined, depending upon the functionality involved.

In particular, the processor 100 or modules 400, 500 of FIG. 15 can be provided by commercially available or custom microprocessor, microcontroller, digital signal processor or the like. Memory may include any memory devices and/or storage media containing the software and data used to implement the functionality circuits or modules used in accordance with embodiments of the present invention. The memory can include, but is not limited to, the following types of devices: ROM, PROM, EPROM, EEPROM, flash memory, SRAM, DRAM and magnetic disk. In some embodiments of the present invention, the memory may be a content addressable memory (CAM).

The velocity and/or displacement data can used to monitor the present extent of erosion of fixed contact 16 and moveable contact 17 and/or predict a remaining useful life of the circuit interrupter 10. As noted above, the amount of compression of spring when circuit interrupter 10 is closed will decrease as the amount of erosion of fixed contact 16 and moveable contact 17 increases. As the compression of spring decreases, the energy stored in spring will, when circuit interrupter 10 is closed, decrease which in turn will cause the velocity and acceleration of the stem 15s during an interruption (i.e., during opening) to decrease as erosion increases.

The interrupt current (amperage of current, typically kA) during an arcing event can also be considered in predicting the remaining useful life of the circuit interrupter 10.

Thus, control circuit 101 can be programmed to monitor velocity and/or displacement over the life of circuit interrupter 10 and determine that erosion of fixed contact 16 and moveable contact 17 has reached or exceeded a predetermined level wherein performance of circuit interrupter 10 may suffer when velocity and/or displacement fall below a defined or predetermined level. As will be appreciated, the particular defined or predetermined level will depend on various factors, such as the construction and characteristics of spring and/or fixed contact 16 and moveable contact 17.

Embodiments of the invention can employ artificial intelligence (AI) that uses statistical analysis such as a Bayesian linear regression at each arcing event to predict a remaining useful end of life in real-time from or during an arcing event (i.e., in a range of about 1 second to about five minutes, depending on bandwidth, for example) from or during an arcing event. The prediction can be updated at each such arcing event as different arcing events, time between successive arcing events, amperage current exposure of the main contacts and erosion can be different at each event.

Figure 16A:
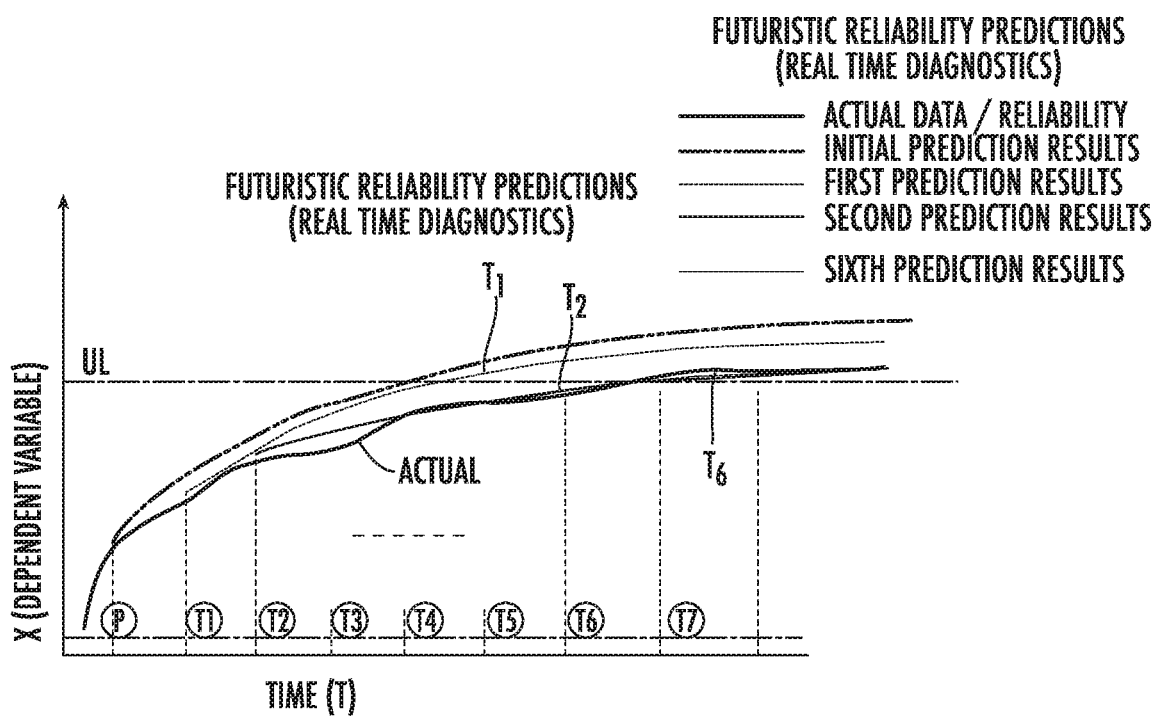
FIG. 16A is a graph of a dependent variable associated with a remaining useful life over time (T) that can change at successive arcing events according to embodiments of the present invention.
Figure 16B:
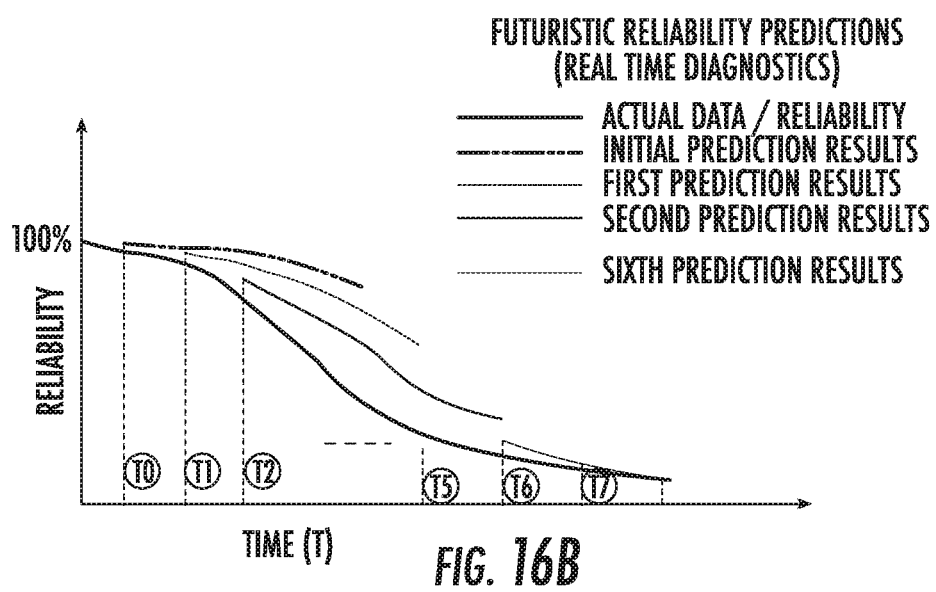
FIG. 16B is a graph of reliability versus time of a futuristic reliability predictions of real-time diagnostics according to embodiments of the present invention.

FIG. 16A illustrates a real time diagnostic/prediction graph of X (contact erosion as dependent variable) at different arcing events from the present "P" to a future time (months, years). FIG. 16B illustrates reliability of a predicted useful life based on actual data, initial prediction result (T0), first prediction result (T1), second prediction result (T2) and a further prediction result shown as sixth prediction result (T6). Thus, with prior acquired data at point P, a predictive erosion for anticipated interruption current and arcing time is provided. When this predicted erosion curve intercepts the upper limit on the erosion limit of the VI (determined from factory set value), the VI loose its useful life. Thus, at any present time (P), use gets the futuristic remaining life of that particular VI. This calculation is performed after each closing operation (e.g. at T1, T2, . . . T7) and futuristic predictions are provided based on various usage of the VI (as shown in Table 1).

Referring again to FIG. 15, the predictive module 500 can predict an exact failure event time with different possible scenarios occurring in the future, e.g., VI failure due to contact wear at 40 kA, 50 kA SCC (short circuit current) condition. The module 500 can rely on the actual physics of failure and corresponding model and can be configured so as to not require an unreasonably large demand of memory for storage. That is, only partially processed data from different displacement data sets can be used and stored as statistical parameters for the module 500. The module 500 can be configured to determine an abnormal data point and alarm the user about the same. Statistical inferences provided such as Reliability, RUL (Remaining Useful Life), and Confidence interval can be provided to distinctively prove the statistical relation between the dependent and independent variables with multidimensionality. The module 500 can be good for data security as the module 500 can mask raw sensor data from displacement curves, for example, and can be sufficiently reliable to avoid false alarming.

Bayesian updating of the predictive useful life can be carried out based on successive sensor data acquisition and data analysis. The following Example is given as an exemplary calculation protocol and application.

Bayesian Linear regression $$y_i = X\beta + \varepsilon_i \qquad \text{Equation 1a}$$

$$\text{Or, } y_i = \beta_1 x_{i_1} + \beta_2 x_{i_2} + \ldots + \beta_k x_{k_1} + \varepsilon_i \text{ for simplicity} \qquad \text{Equation 1b}$$

Where, $y_i = i^{th}$ dependent variable $\in [y_1, y_2, y_3, \ldots, y_n]$

X=Design matrix formed by k independent variables $\in [f_1(x_1), f_2(x_2), \ldots, f_k(x_k)]$.

$[f_1(x_1), f_2(x_2), \ldots, f_k(x_k)]$=Basic functions (can take any form such as exponential, polynomial, logarithmic depending upon the "Physics of the problem".

$\beta$=vector with k parameters forming model equation$\in [\beta_1, \beta_2, \ldots, \beta_k]$ $\varepsilon \sim N(0, \sigma^2)$=independent and identical random variable$\in [\in_1, \in_2, \ldots, \in_k]$ $E(\beta)$=Parameter vector estimator=$\mu = (X^T X)^{-1} X^T y$ Bayesian Terminologies Prior Knowledge of Parameter Vector $$\sigma^2 \sim \text{Inv.Gamma}(a_0, b_0) \; \beta | \sigma^2 \sim N(\mu_0, \sigma^2 \Lambda_0) \qquad \text{Equation A}$$

Posterior Knowledge of Parameter Vector $$\sigma^2 \sim \text{Inv. Gamma } (a_n, b_c) \beta | \sigma^2 \sim N(\mu_n, \sigma^2 \Lambda_n) \qquad \text{Equation B}$$
$$\mu_n = (X^T X + \Lambda_0)^{-1} (\Lambda_0 \mu_0 + X^T y)$$
$$\Lambda_n = (X^T X + \Lambda_0)$$

$$a_n = a_0 + \frac{n}{2} \qquad \text{Equation C}$$
$$b_n = b_0 + \frac{1}{2}(y^T y + \mu_0^T \Lambda_0 \mu_0 - \mu_n^T \Lambda_m \mu_n)$$

Prediction of Dependent Variable on Future Occurrences $$Y_1 \sim N(X_1\beta, \sigma^2 I) \quad \text{Equation D}$$

$Y_1$ is vector of predicted dependent variables for given set of dependent variables
$X_1 \in [f_1(x_1), f_2(x_2), \ldots, f_k(x_k)]$ Application Example The arc energy imparted on the VI contact can be roughly stated in terms of arc current and time using joules heat generated. The contact wear due to this heat can be assumed to be directly proportional to the heat generated.
Hence, $Q = R \times t \times I_{sc}^2 =$ Joules heat generated inside the VI.
Where, R=resistance of the VI current conducting circuit
t=short time current carrying time (usually in ms)
$I_{sc}$=Short circuit current.
The number of operations (NOP) of the VI or life of the VI is inversely proportional to the heat generated (Q) and NOP takes the following form:

$$NOP = K \frac{1}{t \times I_{sc}^2} \quad \text{Equation 2}$$

Where, K=some physical constant for that particular VI~1/R and can be assumed as constant or physical property.
Equation 2 is the physics of failure equation for the VI contact wear, and can be written in the following linear form:

$$\ln(NOP) = \ln(K) - \ln(t) - 2 \times \ln(I_{sc}) \quad \text{Equation 3}$$

Equation 3 can be readily fitted with equation 1b as follows:

$y_i = \ln(NOP)$ $x_{i_1} = \ln(K) = \text{constant } \beta_1 = +1$ $x_{i_2} = \ln(t) \; \beta_2 = -1$ $x_{i_3} = \ln(I_{sc}) \; \beta_3 = -2$ Thus, Equation 3 can be written in the form of equation 1b as:

$$y_i = \beta_1 x_{i_1} + \beta_2 x_{i_2} + \beta_3 x_{i_3} \quad \text{Equation 4}$$

This can be further applied to the Bayesian algorithm as above to predict the dependent variable on future occurrence, per equation D where, the new coefficient matrix β can be updated using equations B & C, with proper application of Monte Carlo method.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the invention.

That which is claimed is:

1. A circuit interrupter, comprising:
a housing comprising a base;
a fixed main contact in the housing;
a movable main contact in the housing in cooperating alignment with the fixed main contact;
an elongate stem coupled to the movable main contact and extending away from the fixed main contact;
a drive assembly coupled to the elongate stem and configured to move the movable main contact between open and closed positions relative to the fixed main contact;
a non-contact sensor comprising an emitter source and a cooperating receiver sensor in the housing configured to acquire a light and/or acoustic signal as a sensor signal that provides displacement data; and
a control circuit in communication with the non-contact sensor that is configured to evaluate erosion status of the fixed and movable main contacts based on the displacement data.

2. The circuit interrupter of claim 1, wherein the non-contact sensor comprises an optical sensor, wherein the emitter source is a light source, and wherein the circuit interrupter comprises at least one internal reflector in optical communication with the emitter source and coupled to the elongate stem.

3. The circuit interrupter of claim 1, wherein the non-contact sensor is an acoustic sensor, and wherein the emitter source is an ultrasound source.

4. The circuit interrupter of claim 1, further comprising an attachment member coupled to a lower end portion of the elongate stem, wherein the attachment member moves in concert with the elongate stem, wherein the circuit interrupter comprises a vacuum chamber enclosing the fixed and movable main contacts, and wherein the elongate stem resides outside the vacuum chamber.

5. The circuit interrupter of claim 4, wherein the attachment member comprises a reflector surface that faces the emitter source.

6. The circuit interrupter of claim 4, wherein the attachment member comprises a receiving channel that slidably receives the elongate stem, and wherein the attachment member comprises a planar surface that faces the emitter source.

7. The circuit interrupter of claim 1, further comprising an attachment member coupled to the elongate stem, wherein the attachment member moves in concert with the elongate stem and holds the emitter source.

8. The circuit interrupter of claim 1, wherein the base comprises a plurality of externally visible wheels, wherein the circuit interrupter is a multiple pole device, wherein the non-contact sensor is provided as a plurality of non-contact sensors, each having a respective emitter source and a corresponding receiver sensor, one for each of the poles, and wherein the control circuit is configured to acquire the sensor signal from each non-contact sensor to evaluate erosion status of a corresponding fixed and movable main contact.

9. The circuit interrupter of claim 1, wherein the control circuit triggers the non-contact sensor to acquire the sensor signal at successive defined intervals during opening and closing of the movable main contact and generates a respective opening and closing travel curve of distance over time.

10. The circuit interrupter of claim 9, wherein the control circuit triggers the non-contact sensor to obtain the sensor signal at successive intervals in response to (i) a trigger signal from a start of the movable main contact closing whereby the movable main contact travels to the closed position and (ii) a trigger signal from a start of opening of the movable main contact whereby the movable main contact travels to the open position.

11. The circuit interrupter of claim 10, wherein at least some of the successive intervals are in a range of 50 μs to 1 millisecond during the opening and the closing.

12. The circuit interrupter of claim 1, wherein the control circuit is configured to determine when displacement data is at a steady state condition associated with a fully open or fully closed state of the circuit interrupter.

13. The circuit interrupter of claim 1, wherein the control circuit is coupled to a current transformer and is configured to obtain interrupt current measurements (amperage) at the current transformer concurrently with acquisition of the displacement data.

14. The circuit interrupter of claim 1, wherein the emitter source is a laser, and wherein the laser and receiver sensor are held by a unitary housing.

15. A circuit interrupter, comprising:
a housing comprising a base;
a fixed main contact in the housing;
a movable main contact in the housing in cooperating alignment with the fixed main contact;
an elongate stem coupled to the movable main contact and extending away from the fixed main contact;
a drive assembly coupled to the elongate stem and configured to move the movable main contact between open and closed positions relative to the fixed main contact;
a non-contact sensor comprising an emitter source and a cooperating receiver sensor in the housing configured to acquire a light and/or acoustic signal as a sensor signal that provides displacement data to thereby allow for evaluation of erosion status of the fixed and movable main contacts; and
a control circuit in communication with the non-contact sensor that triggers the non-contact sensor to acquire the sensor signal at successive defined intervals during opening and closing of the movable main contact and generates a respective opening and closing travel curve of distance over time,
wherein the circuit interrupter is a vacuum interrupter (VI), and wherein the control circuit is configured to identify a service needed date, based, at least in part, on:
(i) a predicted number of operations (NOP) of the VI life which is inversely proportional to the heat generated (Q) and NOP is calculated by:

$$NOP = K \frac{1}{t \times I_{sc}^2}$$

where K=a physical constant for a particular VI, and VI is approximately equal to 1/R and can be assumed as constant or physical property, and
(ii) a physics of failure equation for VI contact wear of the fixed and movable main contacts which is calculated in a linear form by:

$$\ln(NOP) = \ln(K) - \ln(t) - 2 \times \ln(I_{sc})$$

where t=short current carrying time, and $I_{sc}$=short circuit current.

16. A circuit interrupter, comprising:
a housing comprising a base;
a fixed main contact in the housing;
a movable main contact in the housing in cooperating alignment with the fixed main contact;
an elongate stem coupled to the movable main contact and extending away from the fixed main contact;
a drive assembly coupled to the elongate stem and configured to move the movable main contact between open and closed positions relative to the fixed main contact; and
a non-contact sensor comprising an emitter source and a cooperating receiver sensor in the housing configured to acquire a light and/or acoustic signal as a sensor signal that provides displacement data to thereby allow for evaluation of erosion status of the fixed and movable main contacts,
wherein the emitter source is configured to project the sensor signal upward toward the elongate stem.

17. A circuit interrupter, comprising:
a housing comprising a base;
a fixed main contact in the housing;
a movable main contact in the housing in cooperating alignment with the fixed main contact;
an elongate stem coupled to the movable main contact and extending away from the fixed main contact;
a drive assembly coupled to the elongate stem and configured to move the movable main contact between open and closed positions relative to the fixed main contact; and
a non-contact sensor comprising an emitter source and a cooperating receiver sensor in the housing configured to acquire a light and/or acoustic signal as a sensor signal that provides displacement data to thereby allow for evaluation of erosion status of the fixed and movable main contacts,
wherein the emitter source is configured to project the sensor signal laterally inward toward the elongate stem.

18. A circuit interrupter, comprising:
a housing comprising a base;
a fixed main contact in the housing;
a movable main contact in the housing in cooperating alignment with the fixed main contact;
an elongate stem coupled to the movable main contact and extending away from the fixed main contact;
a drive assembly coupled to the elongate stem and configured to move the movable main contact between open and closed positions relative to the fixed main contact; and
a non-contact sensor comprising an emitter source and a cooperating receiver sensor in the housing configured to acquire a light and/or acoustic signal that provides displacement data to thereby allow for evaluation of erosion status of the fixed and movable main contacts,
wherein the emitter source is configured to move in concert with the elongate stem.

19. A circuit interrupter, comprising:
a housing comprising a base;
a fixed main contact in the housing;
a movable main contact in the housing in cooperating alignment with the fixed main contact;
an elongate stem coupled to the movable main contact and extending away from the fixed main contact;
a drive assembly coupled to the elongate stem and configured to move the movable main contact between open and closed positions relative to the fixed main contact; and a non-contact sensor comprising an emitter source and a cooperating receiver sensor in the housing configured to acquire a light and/or acoustic signal that provides displacement data to thereby allow for evaluation of erosion status of the fixed and movable main contacts, wherein the circuit interrupter is a three pole device, wherein the non-contact sensor is provided as three emitter sources and three receiver sensors, one for each of the three poles, and wherein a laterally extending mounting bracket holds the three emitter sources inside the housing, one emitter source aligned with terminals of a respective one of the three poles.

\* \* \* \* \*

UNITED STATES PATENT AND TRADEMARK OFFICE
CERTIFICATE OF CORRECTION

PATENT NO. : 11,004,619 B2
APPLICATION NO. : 16/218549
DATED : May 11, 2021
INVENTOR(S) : Schieltz et al.

Page 1 of 1

It is certified that error appears in the above-identified patent and that said Letters Patent is hereby corrected as shown below:

In the Specification

Column 18, Line 58, Equation B: Please correct "$(a_n, b_c)$" to read -- $(a_n, b_n)$ --

Column 18, Line 64, Equation C: Please correct "$\mu_n^T \Lambda_m \mu_n$" to read -- $\mu_n^T \Lambda_n \mu_n$ --

Signed and Sealed this
Seventh Day of September, 2021

Drew Hirshfeld
*Performing the Functions and Duties of the*
*Under Secretary of Commerce for Intellectual Property and*
*Director of the United States Patent and Trademark Office*